United States Patent
Yoon et al.

(10) Patent No.: US 8,884,687 B2
(45) Date of Patent: Nov. 11, 2014

(54) POWER GATING CIRCUIT

(71) Applicant: Samsung Electronics Co., Ltd., Suwon-si (KR)

(72) Inventors: Jang-Hwan Yoon, Seoul (KR); Jin-Sung Kim, Seoul (KR); Sang-Yeop Baeck, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/867,314

(22) Filed: Apr. 22, 2013

(65) Prior Publication Data

US 2014/0015590 A1  Jan. 16, 2014

(30) Foreign Application Priority Data

Jul. 10, 2012  (KR) .................. 10-2012-0074996

(51) Int. Cl.
  *G05F 1/10*  (2006.01)
  *H03K 17/14*  (2006.01)
  *H03K 19/00*  (2006.01)

(52) U.S. Cl.
  CPC .......... *H03K 17/145* (2013.01); *H03K 19/0016* (2013.01)
  USPC .......................................... 327/544; 326/33

(58) Field of Classification Search
  CPC ............................. H03K 19/0016; G06F 1/32
  USPC ............................................ 327/544; 326/33
  See application file for complete search history.

(56) References Cited

U.S. PATENT DOCUMENTS

| | | | |
|---|---|---|---|
| 5,781,062 A | 7/1998 | Mashiko et al. | |
| 5,875,128 A | 2/1999 | Ishizuka | |
| 6,324,109 B1 | 11/2001 | Inoue | |
| 6,836,179 B2* | 12/2004 | Mizuno et al. | 327/544 |
| 7,219,244 B2* | 5/2007 | Kuang et al. | 713/320 |
| 7,605,644 B2* | 10/2009 | Idgunji et al. | 327/544 |
| 7,696,649 B2* | 4/2010 | Frey et al. | 307/141 |
| 7,737,720 B2* | 6/2010 | Idgunji et al. | 326/33 |
| 7,825,720 B2* | 11/2010 | Ramaraju et al. | 327/543 |
| 7,944,284 B2* | 5/2011 | Blair | 327/540 |
| 8,015,419 B2* | 9/2011 | Rowhani et al. | 713/300 |
| 8,327,163 B2* | 12/2012 | Chen | 713/300 |
| 8,581,637 B2* | 11/2013 | Paul et al. | 327/108 |

(Continued)

FOREIGN PATENT DOCUMENTS

| | | |
|---|---|---|
| JP | 09-064715 | 3/1997 |
| JP | 2001-023387 | 1/2001 |

(Continued)

*Primary Examiner* — Thomas J Hiltunen
(74) *Attorney, Agent, or Firm* — F. Chau & Associates, LLC

(57) ABSTRACT

A power gating circuit includes a first current switch, a second current switch, and a switching controller. The first current switch is connected between a power rail and a circuit block operated by an operating supply voltage, and provides a first current when turned on. The second current switch is connected between the power rail and circuit block, and provides a second current larger than the first current when turned on. The switching controller turns on first current switch when transitioned from a sleep mode to an active mode to change the operating supply voltage using the first current, generates a reference voltage based on the operating supply voltage that changes more slowly than the operating supply voltage, and turns on the second current switch based on the reference voltage to provide the second current to the circuit block.

13 Claims, 16 Drawing Sheets

(56) References Cited

U.S. PATENT DOCUMENTS

| | | | |
|---|---|---|---|
| 8,593,215 B2 * | 11/2013 | Chen | 327/544 |
| 2004/0263237 A1 | 12/2004 | Kim et al. | |
| 2006/0221693 A1 | 10/2006 | Cernea et al. | |
| 2007/0002631 A1 | 1/2007 | Kang et al. | |
| 2007/0189086 A1 | 8/2007 | Choi et al. | |
| 2008/0018389 A1 * | 1/2008 | Kim et al. | 327/544 |
| 2010/0188922 A1 | 7/2010 | Nakaoka | |
| 2010/0295626 A1 | 11/2010 | Kim et al. | |
| 2011/0198941 A1 | 8/2011 | Suzuki et al. | |
| 2011/0198942 A1 | 8/2011 | Takayanagi et al. | |
| 2012/0182792 A1 * | 7/2012 | Cheng et al. | 365/154 |

FOREIGN PATENT DOCUMENTS

| | | |
|---|---|---|
| JP | 2006-329655 | 12/2006 |
| JP | 2010-198718 | 9/2010 |
| KR | 1020010061837 | 7/2001 |
| KR | 1020070003023 | 1/2007 |

* cited by examiner

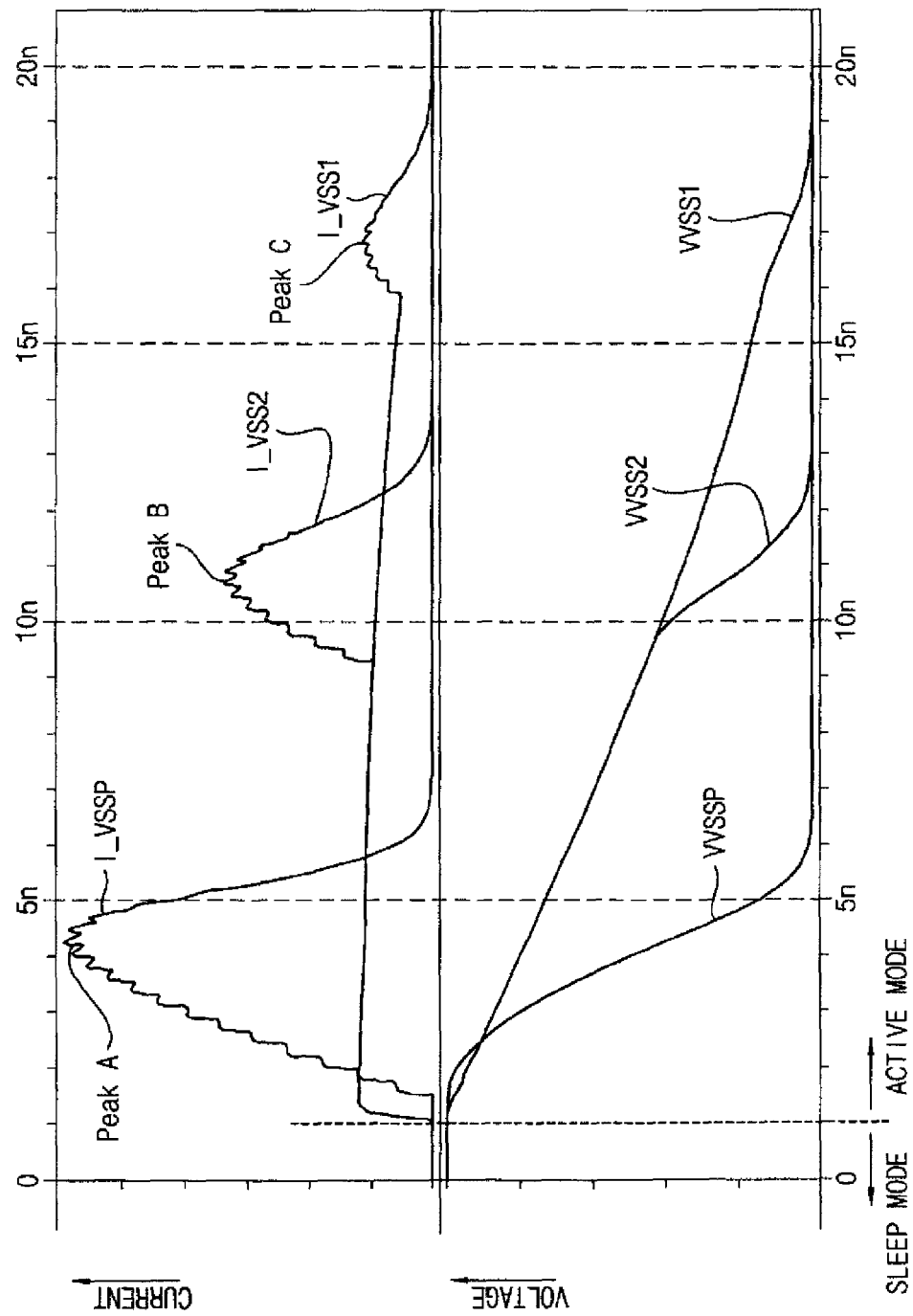

POWER GATING CIRCUIT

CROSS-REFERENCE TO RELATED APPLICATION

This application claims priority under 35 USC §119 to Korean Patent Application No. 10-2012-0074996, filed on Jul. 10, 2012, in the Korean Intellectual Property Office (KIPO), the disclosure of which is incorporated by reference in its entirety herein.

BACKGROUND

1. Technical Field

Exemplary embodiments of the inventive concept relate generally to a power gating circuit of an integrated circuit apparatus, and more particularly to a power gating circuit of a System on Chip (SoC).

2. Discussion of Related Art

Electronic products consume an ever increasing amount of power since they are being equipped with an increasing number of high-performance functions. When these electronic products are mobile devices, they require a battery to supply this power. A System on Chip (SoC) may be employed in an electronic device along with power management software to reduce the amount of power consumed.

A power gating circuit may be used to reduce dynamic and static power dissipations by shutting off the flow of current to blocks of a system that are not currently in use. The power gating circuit may be controlled by a power management unit (PMU) in the system.

The power gating circuit typically includes a time delay circuit. However, the time delay circuit may take up a large area of the page gating circuit. In addition, since a time delay generated by the time delay circuit may vary depending on a variation of process, voltage and temperature (PVT), current may not be effectively controlled.

SUMMARY

At least one exemplary embodiment of the inventive concept provides a power gating circuit capable of acquiring a greater time delay with a reduced area.

At least one exemplary embodiment of the inventive concept provides a power gating circuit capable of minimizing power consumption caused by the power gating circuit itself in an active mode.

At least one exemplary embodiment of the inventive concept provides a power gating circuit capable of reducing a deviation in a time delay according to variation of the process, voltage and temperature.

According to an exemplary embodiment of the inventive concept, a power gating circuit includes a first current switch, a second current switch, and a switching controller. The first current switch is connected between a power rail and a circuit block operated by an operating supply voltage, and provides a first current when the first current switch is turned on (e.g., to change the operating supply voltage). The second current switch is connected between the power rail and the circuit block, and provides a second current larger than the first current when the second current switch is turned on. The switching controller turns on the first current switch when transitioned from a sleep mode to an active mode in response to an operating mode signal to change the operating supply voltage using the first current, generates a reference voltage based on the operating supply voltage, which changes more slowly changed than the operating supply voltage, and turns on the second current switch based on the reference voltage to provide the second current to the circuit block.

In an exemplary embodiment, the switching controller disables a level detection unit, which generates the reference voltage, after turning on the second current switch. The level detection unit may be located within the switching controller.

In an exemplary embodiment, each of the first and second current switches is connected between a high-voltage power line of the power rail and a virtual high-voltage power line that supplies the operating supply voltage to the circuit block, and the switching controller includes a delay buffer that buffers a voltage of a first node to supply the buffered voltage to the second current switch and a voltage detection control buffer that generates the reference voltage maintained lower than the operating supply voltage supplied through the virtual high-voltage power line, outputs the operating mode signal through the first node after delaying a falling transition of the operating mode signal until the reference voltage reaches a predetermined voltage level, and disables a pull-down path between the reference voltage and a low-voltage power line of the power rail in response to an output signal of the delay buffer.

The voltage detection control buffer may include a pull-up transistor connected between the high-voltage power line of the power rail and the first node, a pull-down transistor connected between the first node and the low-voltage power line of the power rail, a first inverter that inverts the operating mode signal to supply the inverted operating mode signal to a gate of the pull-up transistor, a second inverter operated by using the operating supply voltage, the second inverter generating the reference voltage by inverting the operating mode signal to supply the reference voltage to a gate of the pull-down transistor, and a level detection unit connected between a node, to which an output terminal of the second inverter and the gate of the pull-down transistor are connected, and the low-voltage power line of the power rail, pulling down the output terminal of the second inverter through the pull-down path when the reference voltage reaches the predetermined voltage level to maintain the reference voltage to the predetermined voltage level, and disabling the pull-down path based on the output signal of the delay buffer.

The level detection unit may include a first NMOS transistor having a gate and a drain commonly connected to the gate of the pull-down transistor and a second NMOS transistor connected between a source of the first NMOS transistor and the low-voltage power line and having a gate connected to an output terminal of the delay buffer.

The power gating circuit may further include a first PMOS transistor connected between the high-voltage power line of the power rail and the first node and having a gate connected to the virtual high-voltage power line.

The power gating circuit may further include an NMOS transistor connected between the first node and a drain of the pull-down transistor and having a gate connected to the gate of the pull-down transistor, and a second PMOS transistor connected between the high-voltage power line of the power rail and the drain of the pull-down transistor and having a gate connected to the virtual high-voltage power line.

The power gating circuit may further include a capacitor connected between the first node and the low-voltage power line of the power rail.

In an exemplary embodiment, each of the first and second current switches is connected between a virtual low-voltage power line that supplies the operating supply voltage to the circuit block and a low-voltage power line of the power rail, and the switching controller includes a first inverter that inverts the operating mode signal to supply the inverted version of the operating mode signal to the first current switch, a delay buffer that buffers a voltage of a first node to supply the buffered voltage to the second current switch, and a voltage detection control buffer that generates the reference voltage maintained higher than the operating supply voltage supplied through the virtual low-voltage power line, outputs an inverted version of the operating mode signal through the first node after delaying a rising transition of the inverted version of the operating mode signal until the reference voltage reaches a predetermined voltage level, and disables a pull-up path between the reference voltage and a high-voltage power line of the power rail in response to an output signal of the delay buffer.

The voltage detection control buffer may include a pull-up transistor connected between the high-voltage power line of the power rail and the first node, a pull-down transistor connected between the first node and the low-voltage power line of the power rail and having a gate receiving the operating mode signal, a second inverter that inverts the operating mode signal, a third inverter operated by using the operating supply voltage, the third inverter generating the reference voltage by inversing an output signal of the second inverter to supply the reference voltage to a gate of the pull-up transistor, and a level detection unit connected between a node, to which an output terminal of the third inverter and the gate of the pull-up transistor are connected, and the high-voltage power line of the power rail, pulling up the output terminal of the third inverter through the pull-up path when the reference voltage reaches the predetermined voltage level to maintain the reference voltage to the predetermined voltage level, and disabling the pull-up path based on the output signal of the delay buffer.

The level detection unit may include a first PMOS transistor having a gate and a drain commonly connected to the gate of the pull-up transistor and a second PMOS transistor connected between a source of the first PMOS transistor and the high-voltage power line and having a gate connected to an output terminal of the delay buffer.

The power gating circuit may further include a first NMOS transistor connected between the first node and the low-voltage power line of the power rail and having a gate connected to the virtual low-voltage power line.

The power gating circuit may further include a PMOS transistor connected between the first node and a drain of the pull-up transistor and having a gate connected to the gate of the pull-up transistor and a second NMOS transistor connected between the low-voltage power line of the power rail and the drain of the pull-up transistor and having a gate connected to the virtual low-voltage power line.

The power gating circuit may further include a capacitor connected between the first node and the low-voltage power line of the power rail.

According to an exemplary embodiment of the inventive concept, a power gating circuit includes a first current switch, a second current switch, an inverter, and a NAND unit. The first current switch is connected between a high-voltage power line of a power rail and a virtual high-voltage power line of a circuit block and is switched in response to an operating mode signal. The second current switch is connected between the high-voltage power line of the power rail and the virtual high-voltage power line of the circuit block, has a current driving capability larger than a current driving capability of the first current switch and is switched in response to a switching control signal. The inverter inverts the operating mode signal. The NAND unit generates the switching control signal by performing an NAND operation on an output voltage of the inverter and a voltage of the virtual high-voltage power line of the circuit block.

According to an exemplary embodiment of the inventive concept, a power gating circuit includes a first current switch, a second current switch, an inverter, and a NOR unit. The first current switch is connected between a low-voltage power line of a power rail and a virtual low-voltage power line of a circuit block and switched in response to an inverted version of an operating mode signal. The second current switch is connected between the low-voltage power line of the power rail and the virtual low-voltage power line of the circuit block, having a current driving capability larger than a current driving capability of the first current switch and switched in response to a switching control signal. The inverter inverts an operating mode signal to output the inverted version of the operating mode signal. The NOR unit generates the switching control signal by performing a NOR operation on a voltage of the virtual low-voltage power line and the operating mode signal.

The power gating circuit may further include a delay buffer that delays the switching control signal, and a third current switch connected between the high-voltage power line of the power rail and the virtual high-voltage power line of the circuit block, where the third current switch is switched in response to the delayed switch control signal provided to the third current switch after the second current switch is turned on. A current driving capability of the third current switch may be the same as the second current switch.

BRIEF DESCRIPTION OF THE DRAWINGS

Exemplary embodiments of the inventive concept will be more clearly understood from the following detailed description in conjunction with the accompanying drawings.

FIG. 16 is a view showing exemplary waveforms to explain operations of the footer-type power gating circuits according to exemplary embodiments.

DETAILED DESCRIPTION

Figure 1:
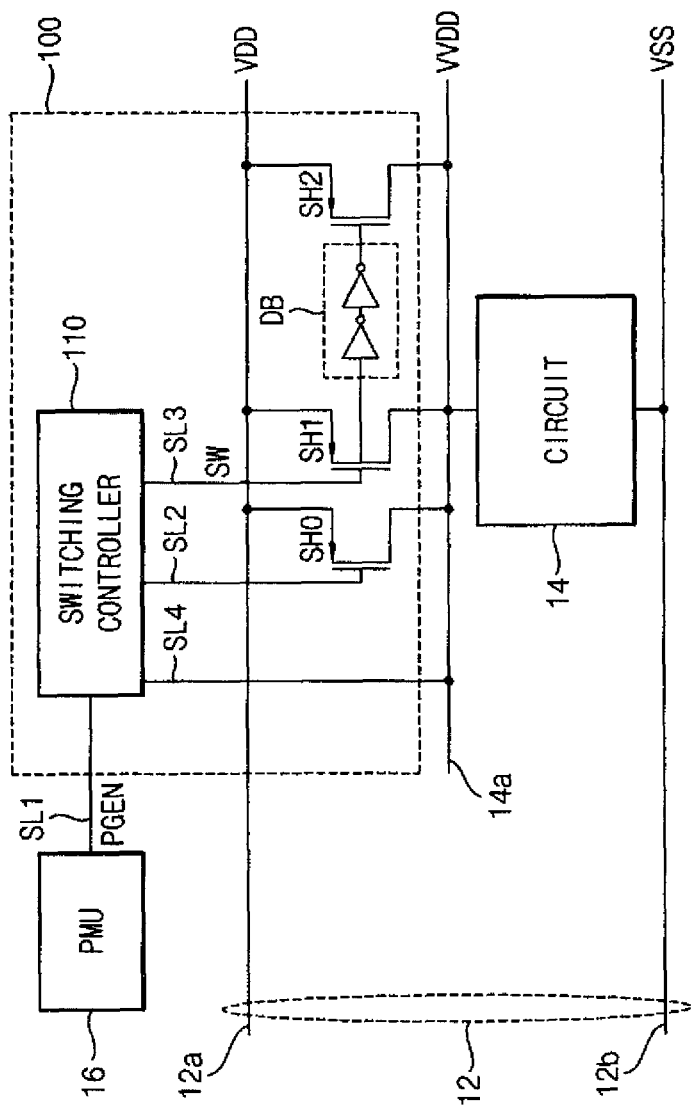
FIG. 1 is a block diagram illustrating a header-type power gating circuit of an integrated circuit apparatus according to an exemplary embodiment of the inventive concept.

The inventive concept will be described more fully with reference to the accompanying drawings, in which some exemplary embodiments thereof are shown. The present inventive concept may, however, be embodied in many different forms and should not be construed as limited to the embodiments set forth herein. Like reference numerals refer to like elements throughout this application.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

FIG. 1 is a block diagram illustrating a header-type power gating circuit of an integrated circuit apparatus according to an exemplary embodiment of the inventive concept.

Referring to FIG. 1, a power rail 12 connected to an external power source is provided in an integrated circuit apparatus 10. In an exemplary embodiment, the power rail 12 is directly connected to the external power source. The power rail 12 includes a high-voltage power line 12a for high voltage VDD and a low-voltage power line 12b for low voltage VSS. In an exemplary embodiment, the low voltage VSS is a ground voltage. The integrated circuit apparatus 10 includes one or more circuit blocks 14. Each circuit block 14 is connected between a virtual high-voltage power line 14a and the low-voltage power line 12b and receives a virtual high voltage VVDD serving as an operating supply voltage through the virtual high-voltage power line 14a. A power gating circuit 100 is connected between the high-voltage power line 12a and the virtual high-voltage power line 14a. The power gating circuit 100 includes current switches SH0, SH1 and SH2 and a switching controller 110. In an exemplary embodiment, the current switches SH0, SH1 and SH2 are embodied with transistors (e.g., PMOS transistors). In an exemplary embodiment where only two switches SH0 and SH1 are provided (e.g., third current switch SH2 is omitted), the current driving capability of the second current switch SH1 is greater than the current driving capability of the first current switch SH0. When the switches (e.g., SH0, SH1, and SH2) are embodied with a transistor, the current driving capability of the transistor may correspond to the aspect ratio of the transistor channel width to the transistor channel length. For example, a first current is driven when the first current switch SH0 is turned on and a second current larger than the first current is driven when the second current switch SH1 is turned on. For example, the first current switch SH0 provides the first current when the first current switch SH0 is turned on and the second current switch SH1 provides the second current when the second current switch SH1 is turned on. In an exemplary embodiment where at least three current switches SH0, SH1 and SH2 are provided, the remaining current switches SH1 and SH2 except for the first current switch SH0 have the same current driving capability. The switching controller 110 receives a power gating enable signal PGEN serving as an operating mode signal from a power management unit PMU 16 through a signal line SL1. In an exemplary embodiment, the power gating enable signal PGEN is maintained in a high state in a sleep mode and is maintained in a low state in an active mode. The switching controller 110 applies the operating mode signal to a gate of the first current switch SH0 through a signal line SL2 without delay or without significant delay. In addition, the switching controller 110 applies the operating mode signal to a gate of the second current switch SH1 through a signal line SL3 as a switching control signal SW by delaying the operating mode signal. The switching controller 110 receives the virtual high voltage VVDD through a signal line SL4 and detects a level of the virtual high voltage VVDD to determine the delay characteristic of the switching control signal SW. After the second current switch SH1 is turned on, a delayed switching control signal SW is transferred to a gate of the third current switch SH2 through a delay buffer DB so that the first to third current switches SH0, SH1 and SH2 are sequentially turned on. Therefore, a large supply current is generated from a power source after the voltage level of the virtual high-voltage power line 14a has been sufficiently increased by a small supply current. As such, power noise may be prevented.

For example, in the initial stage of converting the mode from the sleep mode to the active mode in response to the operating mode signal, the switching controller 110 turns on the first current switch SH0 to gradually increase the operating supply voltage VVDD using the first current, which is relatively small, and generates a reference voltage VREF (e.g., see FIG. 2 and FIG. 3), which changes more slowly than the operating supply voltage VVDD, based on the operating supply voltage VVDD. In addition, the switching controller 110 turns on the second current switch SH1 based on the level of the reference voltage VREF to supply the second current, which is relatively large, to the circuit block 14. Thus, according to the exemplary embodiment, a time delay characteristic greater than the time delay characteristic obtained by the delay buffer DB can be acquired through the switching controller 110, so an area occupied by the delay buffer DB can be reduced.

When the switches SH0-SH2 are embodied with transistors, they may be referred to as sleep transistors. In an exemplary embodiment, if power lines are arranged in a grid type and a plurality of the sleep transistors are arranged in a lattice structure, a greater effect may be expected.

Figure 2:
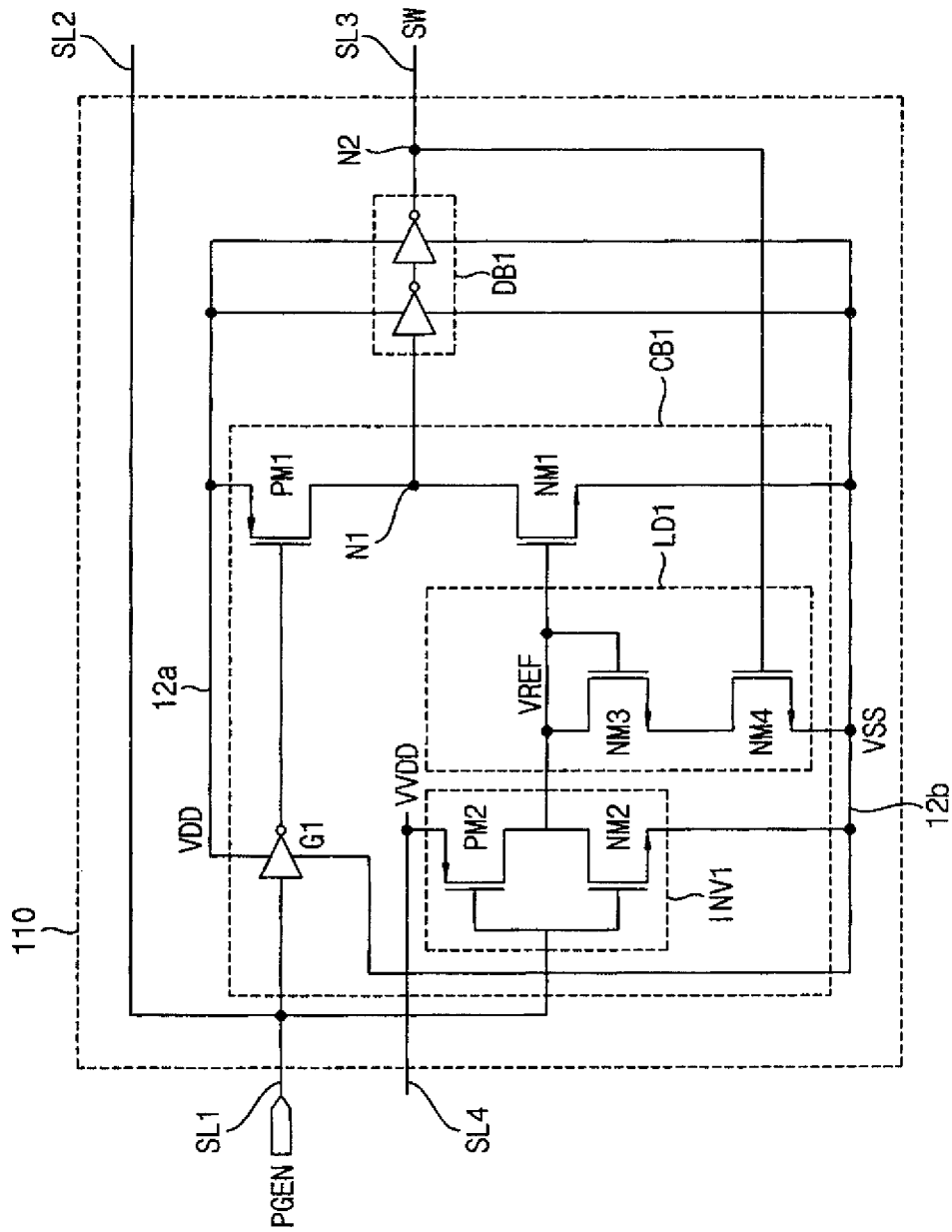
FIG. 2 is a detailed circuit diagram illustrating a switching controller shown in FIG. 1 according to an exemplary embodiment of the inventive concept.

FIG. 2 is a detailed circuit diagram illustrating the switching controller shown in FIG. 1 according to an exemplary embodiment of the inventive concept.

The switching controller 110 includes a delay buffer DB1 and a voltage detection control buffer CB1. The delay buffer DB1 is connected between a first node N1 and a second node N2 and supplies voltage to the second current switch SH1 through the signal line SL3 as the switching control signal SW by buffering voltage of the first node N1.

The voltage detection control buffer CB1 generates the reference voltage VREF, which is maintained lower than the operating supply voltage VVDD supplied through the virtual high-voltage power line 14a, and outputs the operating mode signal PGEN through the first node N1 after delaying a falling transition of the operating mode signal PGEN until the reference voltage VREF reaches a predetermined voltage level. In addition, the voltage detection control buffer CB1 disables a pull-down path between the reference voltage VREF and the low-voltage power line 12b of the power rail 12 in response to an output signal of the delay buffer DB1.

The voltage detection control buffer CM includes a pull-up transistor PM1, a pull-down transistor NM1, inverters G1 and INV1 and a level detection unit LD1. The pull-up transistor PM1 is connected between the high-voltage power line 12a of the power rail 12 and the first node N1 and the operating mode signal PGEN is applied to a gate of the pull-up transistor PM1 through the inverter G1. The pull-down transistor NM1 is connected between the low-voltage power line 12b of the power rail 12 and the first node N1. The inverter G1 receives the supply voltage VDD and VSS through the power rail 12 and applies the operating mode signal PGEN to the gate of the pull-up transistor PM1 by inverting the operating mode signal PGEN. The inverter INV1 is operated by using the operating supply voltage VVDD supplied through the virtual high-voltage power line 14a and generates the reference voltage VREF by inverting the operating mode signal PGEN to apply the reference voltage VREF to the gate of the pull-down transistor NM1. The inverter INV1 includes a PMOS transistor PM2 having a source connected to the virtual high-voltage power line 14a through a signal line SL4 and a drain connected to the gate of the pull-down transistor NM1 and an NMOS transistor NM2 having a drain connected to the gate of the pull-down transistor NM1 and a source connected to the low-voltage power line 12b of the power rail 12. The operating mode signal PGEN is commonly applied to the gates of the PMOS transistor PM2 and the NMOS transistor NM2.

The level detection unit LD1 includes an NMOS transistor NM3 having a gate and a drain commonly connected to the gate of the pull-down transistor NM1 and an NMOS transistor NM4 connected between the source of the NMOS transistor NM3 and the low-voltage power line 12b and having a gate connected to the second node N2.

Figure 3:
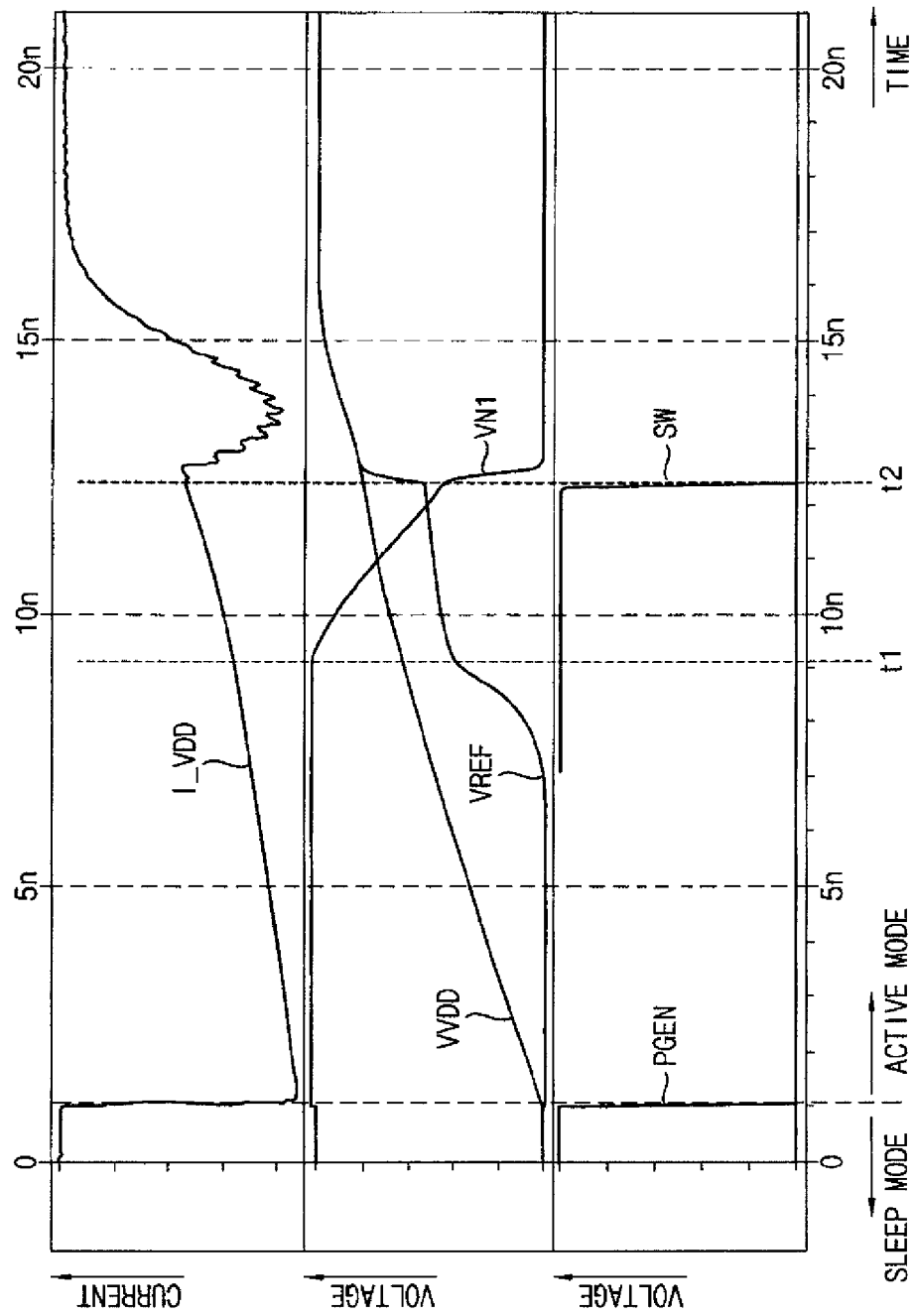
FIG. 3 is a view illustrating exemplary waveforms to explain an operation of the header-type power gating circuit shown in FIGS. 1 and 2 according to an exemplary embodiment.

FIG. 3 is a view illustrating exemplary waveforms to explain an operation of an exemplary embodiment of the inventive concept shown in FIGS. 1 and 2.

Referring to FIG. 3, when the operating mode signal PGEN transitions from the high state to the low state at the time t0, the first current switch SH0 is turned on, so supply current I_VDD that is relatively small flows from the high-voltage power line 12a to the virtual high-voltage power line 14a. Thus, the virtual high voltage VVDD of the virtual high-voltage power line 14a is gradually increased due to the supply current I_VDD. At the same time, since a signal having the high state is applied to the gate of the pull-up transistor PM1 through the inverter G1, the pull-up transistor PM1 is turned off and a pull-up current supplied to the first node N1 is shut off. However, the inverter INV1 is operated by using the operating supply voltage VVDD and the operating supply voltage VVDD is in the low state when the operating mode signal PGEN is initially transitioned from the high state to the low state, so the inverter INV1 may not instantly transfer the operating mode signal PGEN to the gate of the pull-down transistor NM1. Therefore, both of the pull-up transistor PM1 and the pull-down transistor NM1 are kept in the turn-off state, so the first node N1 is maintained in the floating state. Thus, voltage VN1 of the first node N1 is maintained at the previous state, that is, the high state. Accordingly, the NMOS transistor NM4 of the level detection unit LD1 is kept in the turn-on state to provide the pull-down path between the reference voltage VREF and the low-voltage power line 12b of the power rail 12, so that the level detection unit LD1 is maintained in the level detection enable state.

In addition, when the level of the operating supply voltage VVDD supplied through the virtual high-voltage power line 14a is equal to or less than a threshold voltage of the PMOS transistor PM2, the PMOS transistor PM2 is kept in the turn-off state, so the gate of the pull-down transistor NM1 is maintained in the floating state. In other words, the gate of the pull-down transistor NM1 is maintained in the previous state, that is, the low state. Thus, the reference voltage VREF is maintained in the level of the low voltage VSS.

As the level of the operating supply voltage VVDD, which is the voltage of the virtual high-voltage power line 14a, is increased, the PMOS transistor PM2 is turned on, so that the reference voltage VREF starts to increase. Since the reference voltage VREF is generated by using the operating supply voltage VVDD, the reference voltage VREF is always kept lower than the operating supply voltage VVDD. At the time t1 at which the reference voltage VREF is increased greater than the level of threshold voltage VTH_NM3 of the NMOS transistor NM3, the NMOS transistor NM3 is turned on and the level of the reference voltage VREF is expressed by equation 1 as follows:

$$VREF=VTH\_NM3+(Ron\_NM4*Id)+VSS \qquad (1).$$

In the above equation 1, Ron_NM4 represents a resistance of the NMOS transistor NM4 when the NMOS transistor NM4 is turned on and Id represents the current flowing through the NMOS transistors NM3 and NM4 from the reference voltage VREF.

Since all of the NMOS transistors NM3 and NM4 included in the level detection unit LD1 are turned on and the pull-down path between the reference voltage VREF and the low-voltage power line 12b of the power rail 12 is enabled, the signal output from an output terminal of the inverter INV1 is pulled-down through the pull-down path, so the reference voltage VREF is substantially maintained at VTH_NM3+(Ron_NM4*Id)+VSS.

At this time, the pull-down transistor NM1 is also turned on, so charges stored in the first node N1 are discharged through the pull-down transistor NM1. Thus, voltage VN1 of the first node N1 gradually decreases. At this time, as described above, since the gate voltage of the pull-down transistor NM1 is substantially maintained without being increased along the rise slope of the operating supply voltage VVDD, the voltage VN1 of the first node N1 is slowly pulled-down without being rapidly pulled-down. If the voltage VN1 of the first node N1 is decreased lower than the switching point of the delay buffer DB1 at the time t2, the switching control signal SW, which is output through the second node N2 and supplied to the second current switch SH1, is transitioned from the high state to the low state, so that the second current switch SH1 is turned on. As shown in FIG. 3, when the second current switch SH1 is turned on, the supply current I_VDD, which is generated from the high voltage VDD, increases instantly or rapidly. However, since the operating supply voltage VVDD has been sufficiently increased, the intensity of the supply current I_VDD instantly generated or rapidly generated from the high voltage VDD when the second current switch SH1 is turned on may not be high.

In addition, the switching control signal SW transitioned to the low state is fed back from the second node N2 to the NMOS transistor NM4, so the NMOS transistor NM4 is turned off. Thus, the pull-down path supplied by the level detection unit LD1 between the reference voltage VREF and the low-voltage power line 12b of the power rail 12 is disabled.

If the NMOS transistor NM4 is turned off, the gate voltage of the pull-down transistor NM1 is rapidly increased along the slope of the operating supply voltage VVDD, so a drain current of the pull-down transistor NM1 may be maximized. Thus, the voltage VN1 of the first node N1 is rapidly pulled-down to the level of the low voltage VSS.

In the active mode, the NMOS transistor NM4 is turned off and the pull-down path of the level detection unit LD1 is shut off, to prevent power consumption by the switching controller 110.

Therefore, as shown in FIG. 3, according to an exemplary embodiment of the inventive concept, the second current switch SH1 capable of driving a relatively large current can be turned on after a sufficient time delay of 10 ns or more from the time t0 at which the operating mode signal PGEN is transitioned to the low state so that the sleep mode is converted into the active mode. Further, the above configuration can effectively reduce the area occupied by the power gating circuit.

Figure 4:
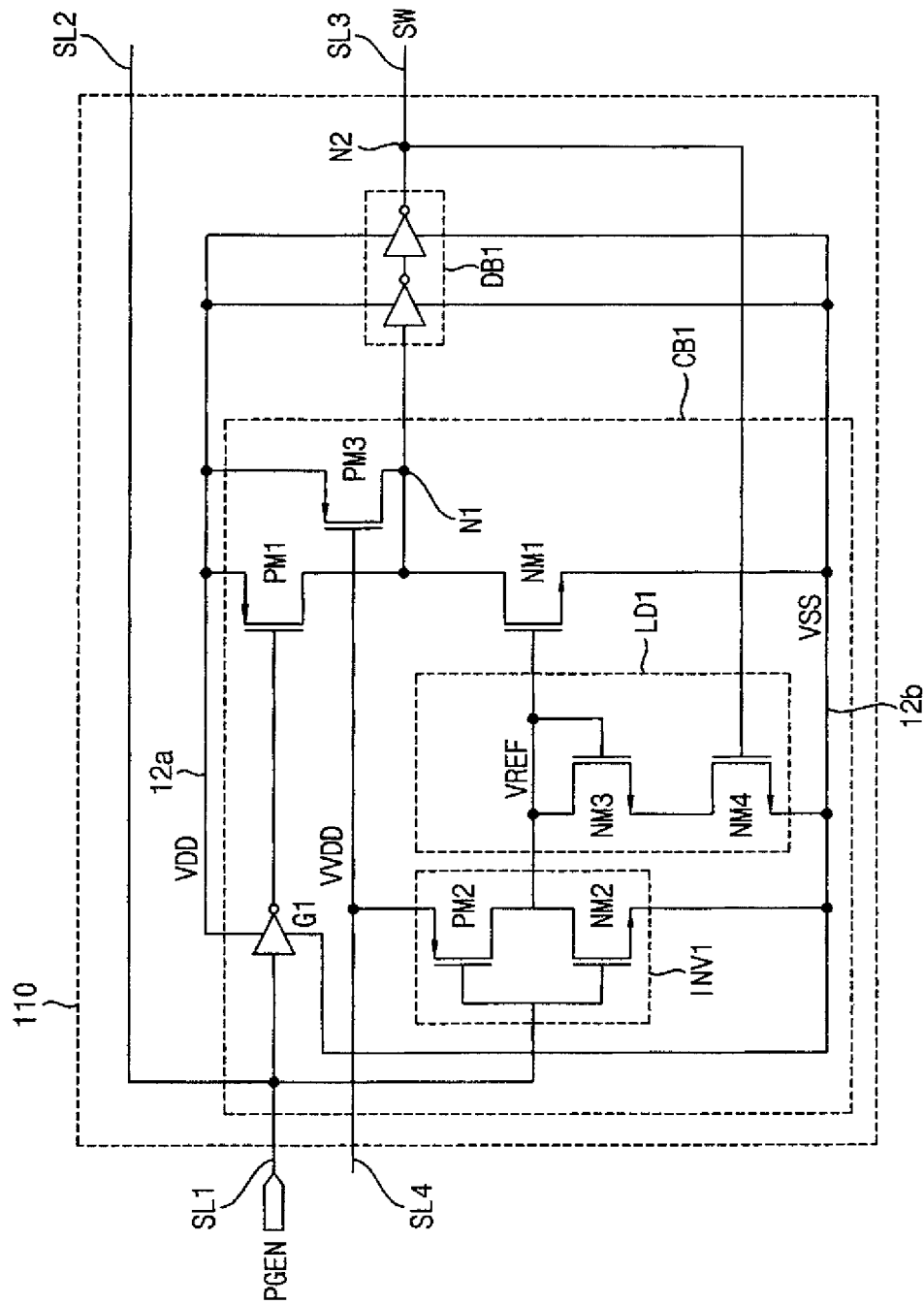
FIG. 4 is a detailed circuit diagram illustrating a switching controller shown in FIG. 1 according to an exemplary embodiment of the inventive concept.

FIG. 4 is a detailed circuit diagram illustrating the switching controller shown in FIG. 1 according to an exemplary embodiment of the inventive concept.

The exemplary embodiment is similar to the exemplary embodiment illustrated in FIG. 2 except that a pull-up transistor PM3 is further connected between the high-voltage power line 12a and the first node N1 and the operating supply voltage VVDD is applied to a gate of the pull-up transistor PM3, so the same reference numerals will be assigned to the same elements.

Since the pull-up transistor PM3 can supply current to the first node N1 until the operating supply voltage VVDD sufficiently increases such that the pull-up transistor PM3 is turned off, the pull-down time caused by the discharge of the first node N1 can be more delayed.

Therefore, according to the exemplary embodiment, the turn-on time of the second current switch SH1 can be more delayed from the time at which the operating mode signal PGEN is transitioned to the low state so that the sleep mode is converted into the active mode.

Figure 5:
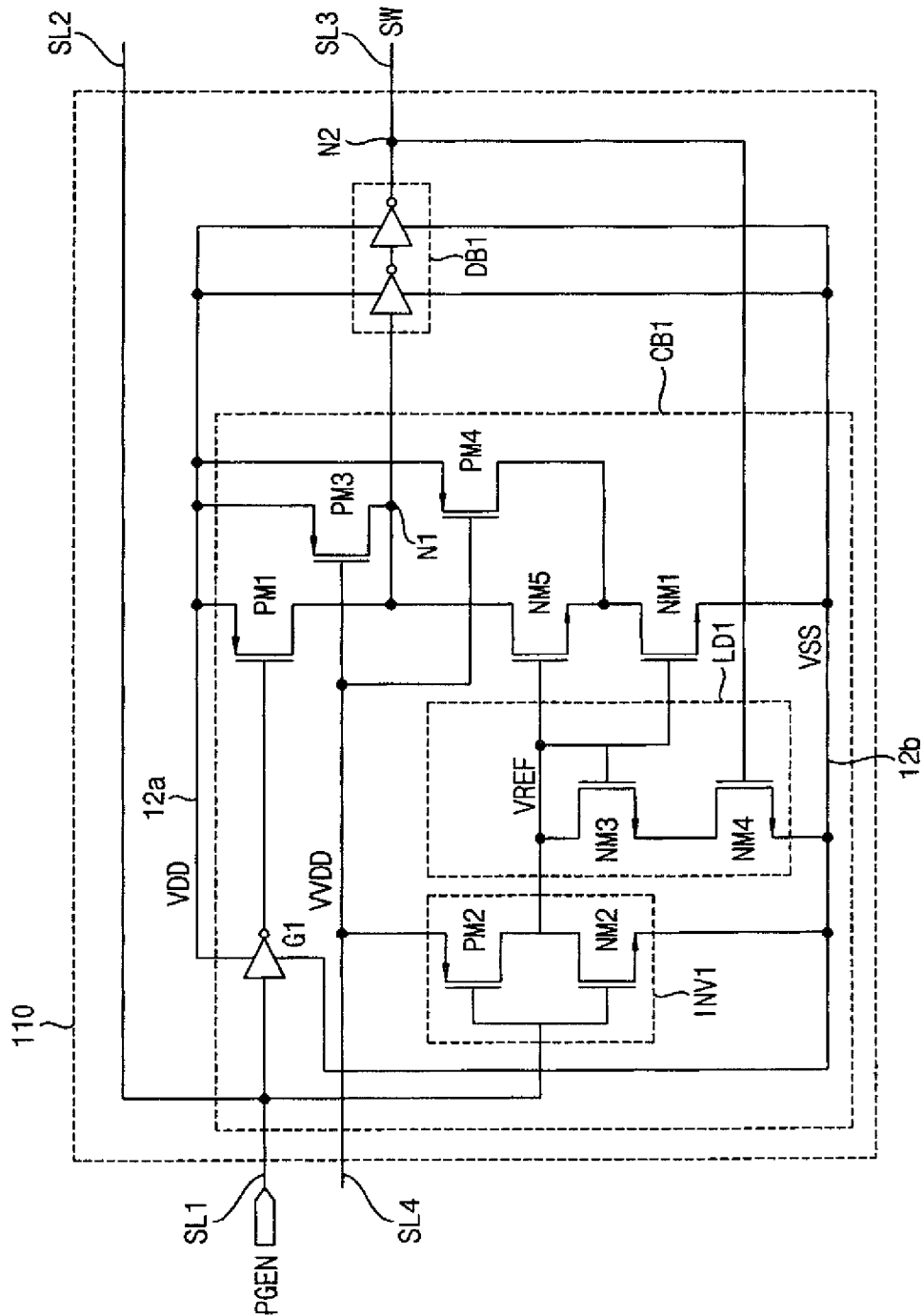
FIG. 5 is a detailed circuit diagram illustrating a switching controller shown in FIG. 1 according an exemplary embodiment of the inventive concept.

FIG. 5 is a detailed circuit diagram illustrating the switching controller shown in FIG. 1 according to an exemplary embodiment of the inventive concept.

The exemplary embodiment is similar to the exemplary embodiment illustrated in FIG. 4 except that an NMOS transistor NM5 is further connected between the first node N1 and the drain of the pull-down transistor NM1 and a PMOS transistor PM4 is further connected between the high-voltage power line 12a and the drain of the pull-down transistor NM1, so the same reference numerals will be assigned to the same elements.

A gate of the NMOS transistor NM5 is connected to the gate of the pull-down transistor NM1 and the operating supply voltage VVDD is applied to a gate of the PMOS transistor PM4. Thus, the NMOS transistor NM5 is not turned on by the PMOS transistor PM4 unless the operating supply voltage VVDD is sufficiently increased to turn off the PMOS transistor PM4, so the discharge path of the first node N1 is shut off. After the operating supply voltage VVDD is sufficiently increased to turn off the PMOS transistor PM4, the NMOS transistor NM5 is turned on. If the NMOS transistor NM5 is turned on, the discharge path of the first node N1 is formed so that the pull-down starts. Therefore, the second current switch SH1 is turned on after a time has been delayed more than the delay time of the exemplary embodiments illustrated in FIG. 2 and FIG. 3, so a large current starts to flow after the operating supply voltage VVDD substantially reaches the high voltage VDD, thereby reducing the power noise.

Figure 6:
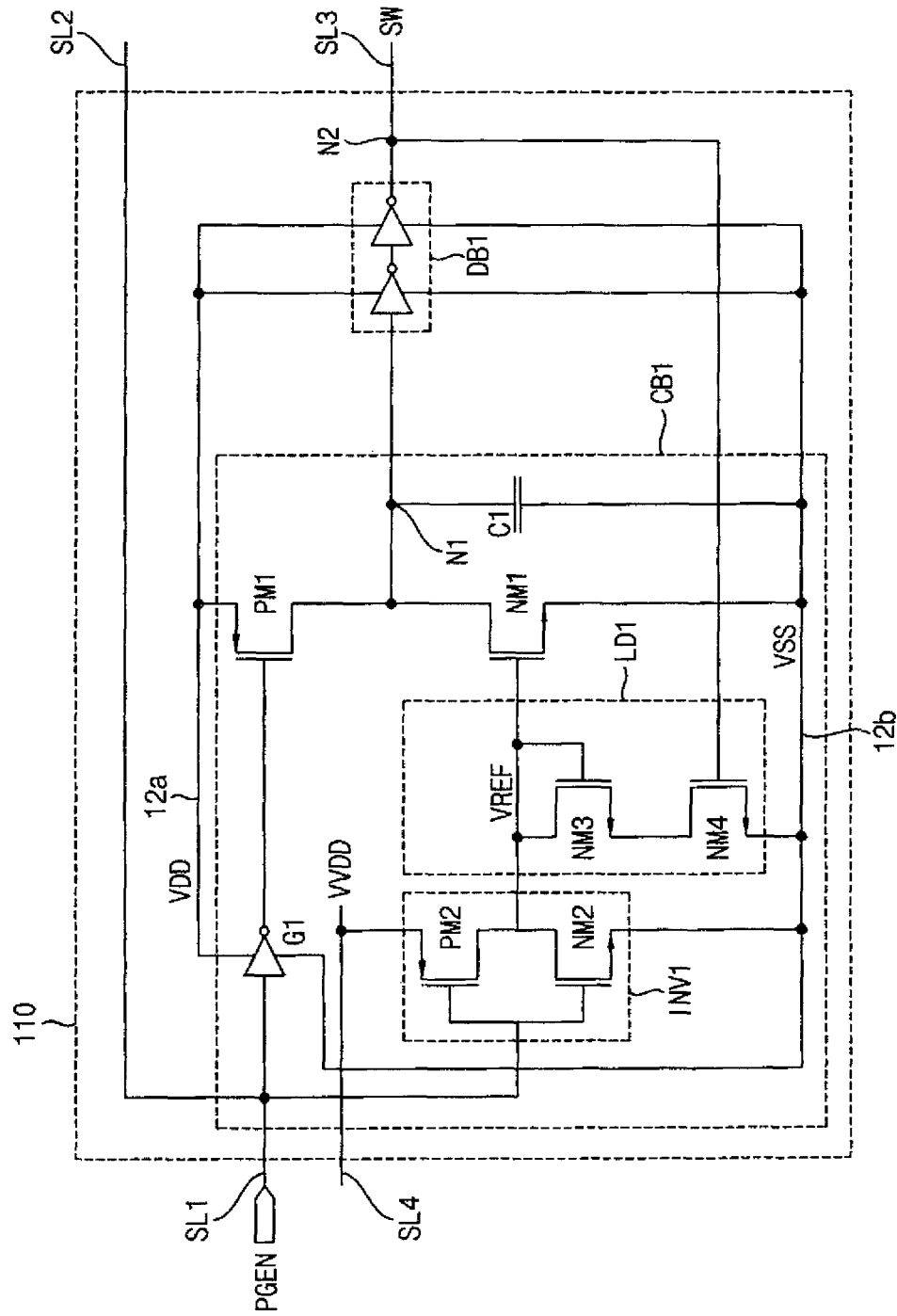
FIG. 6 is a detailed circuit diagram illustrating a switching controller shown in FIG. 1 according to an exemplary embodiment of the inventive concept.

FIG. 6 is a detailed circuit diagram illustrating the switching controller shown in FIG. 1 according to an exemplary embodiment.

The exemplary embodiment is different from other exemplary embodiments in that a capacitor C1 is connected between the first node N1 and the low-voltage power line 12b. Since the capacitor C1 is sufficiently charged with charges supplied to the first node N1 during the sleep mode, the capacitor C1 delays the time for dropping the level of the first node N1 to the switching point of the delay buffer DB 1 when the discharge path is formed through the pull-down transistor NM1.

Figure 7:
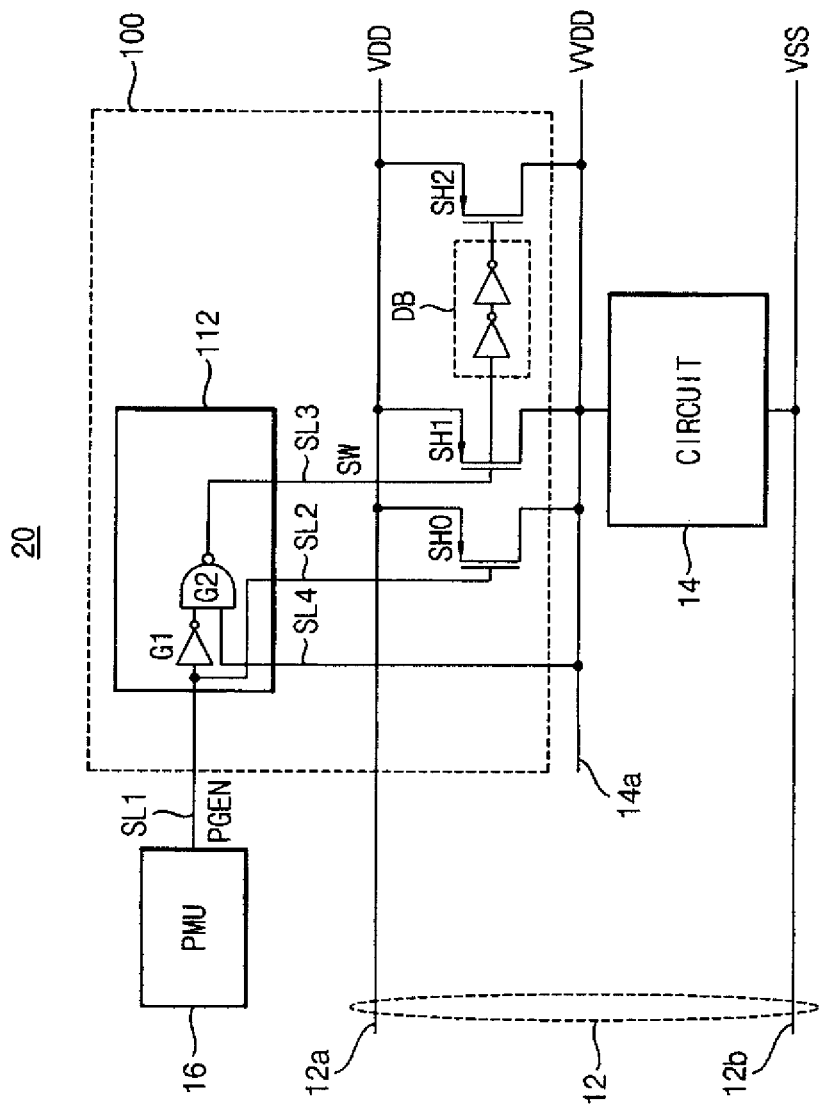
FIG. 7 is a detailed circuit diagram illustrating a switching controller shown in FIG. 1 according to an exemplary embodiment of the inventive concept.

FIG. 7 is a detailed circuit diagram illustrating the switching controller shown in FIG. 1 according to an exemplary embodiment of the inventive concept.

Referring to FIG. 7, an integrated circuit apparatus 20 according to an exemplary embodiment of the inventive concept is different from other exemplary embodiments in that a switching controller 112 includes an inverter G1 and a NAND gate G2.

The signal line SL1 through which the operating mode signal PGEN is provided is connected to one input terminal of the NAND gate G2 through the inverter G1. The virtual high-voltage power line 14a is connected to the other input terminal of the NAND gate G2 through the signal line SL4. The output signal of the NAND gate G2 is the switching control signal SW. An output terminal of the NAND gate G2 is connected to the signal line SL3.

Therefore, the NAND gate G2 delays the output of the operating mode signal PGEN applied to the one input terminal until the level of the operating supply voltage VVDD of the virtual high-voltage power line 14a is sufficiently increased higher than the threshold voltage of the NAND gate G2.

Figure 8:
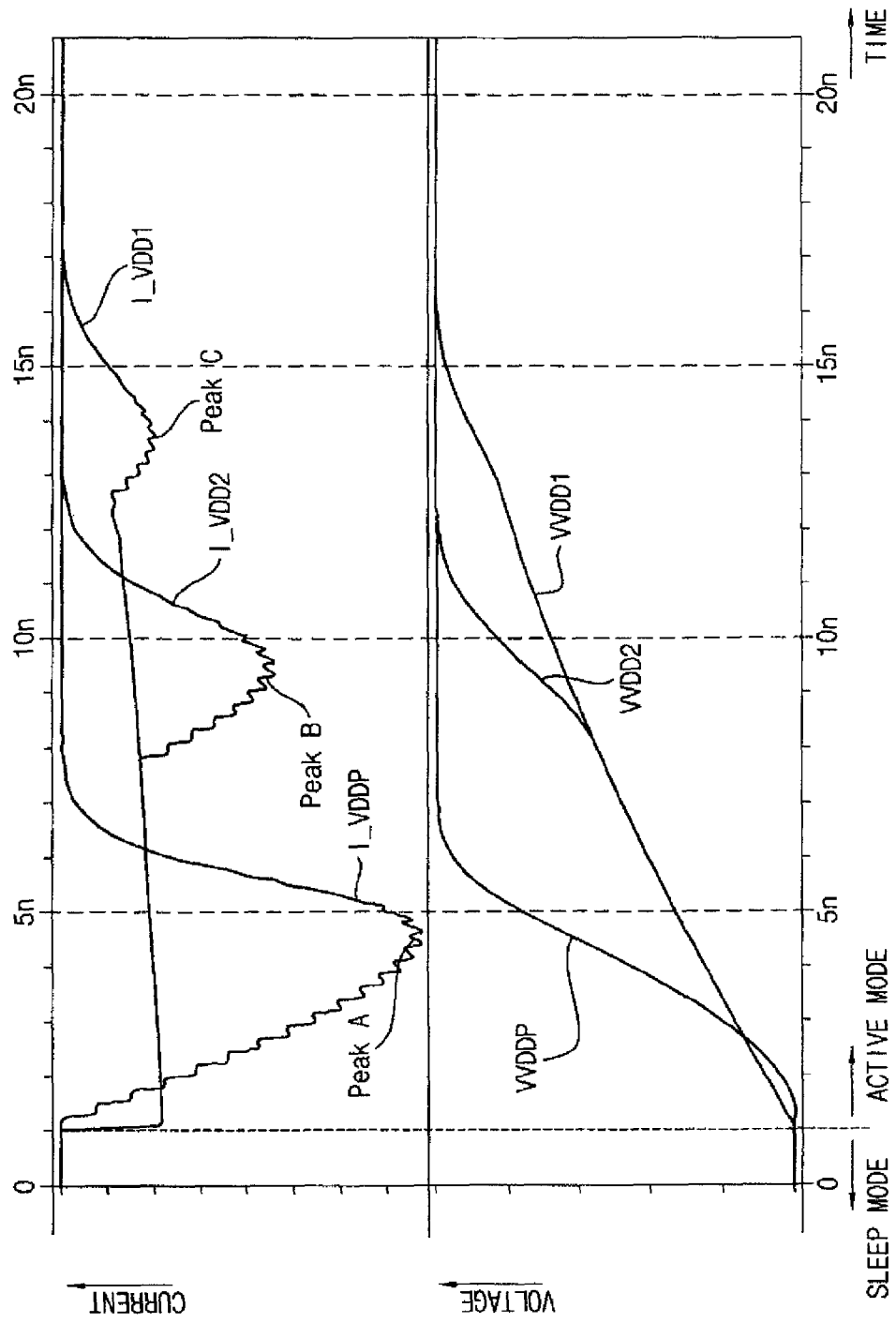
FIG. 8 is a view showing exemplary waveforms to explain operations of the header-type power gating circuits according to exemplary embodiments.

FIG. 8 is a view showing exemplary waveforms to explain operations of the header-type power gating circuits according to exemplary embodiments of the inventive concept.

In FIG. 8, VVDDP represents a typical operating supply voltage, VVDD1 represents the operating supply voltage according to the exemplary embodiment described with reference to FIG. 2, VVDD2 represents the operating supply voltage according to the exemplary embodiment described with reference to FIG. 7, I_VDDP represents current generated from the high voltage according to the typical operating supply voltage, I_VDD1 represents current generated from the high voltage according to the exemplary embodiment described with reference to FIG. 2, and I_VDD2 represents current generated from the high voltage according to the exemplary embodiment described with reference to FIG. 7.

As shown in FIG. 8, unlike the exemplary embodiment of FIG. 2, the exemplary embodiment of FIG. 7 cannot acquire the sufficient delay time of 10 ns or more, but can acquire the delay time substantially approximate to 10 ns.

In addition, as shown in FIG. 8, when comparing with the peak value A of the current I_VDDP, it can be understood that the peak value B of the current I_VDD2 according to the exemplary embodiment of FIG. 7 is reduced by about 42%, and the peak value C of the current I_VDD1 according to the exemplary embodiment of FIG. 2 is reduced by about 72%.

Figure 9:
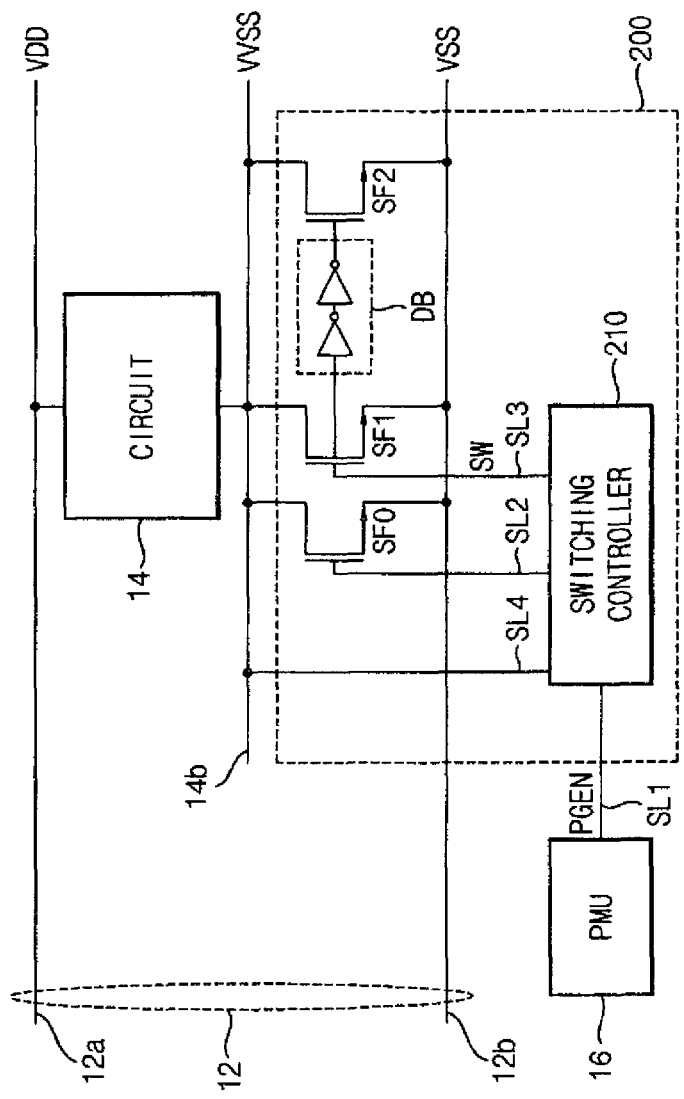
FIG. 9 is a block diagram illustrating a footer-type power gating circuit of an integrated circuit apparatus according to an exemplary embodiment of the inventive concept.

FIG. 9 is a block diagram illustrating a footer-type power gating circuit of an integrated circuit apparatus according to an exemplary embodiment of the inventive concept.

Referring to FIG. 9, a power rail 12 connected to an external power source is provided in an integrated circuit apparatus 30. In an exemplary embodiment, the power rail 12 may be directly connected to the external power source. The power rail 12 includes a high-voltage power line 12a for high voltage VDD and a low-voltage power line 12b for low voltage VSS. The integrated circuit apparatus 30 includes one or more circuit blocks 14. Each circuit block 14 is connected between the high-voltage power line 12a and a virtual low-voltage power line 14b and receives a virtual low voltage VVSS serving as an operating supply voltage through the virtual low-voltage power line 14b. A power gating circuit 200 is connected between the virtual low-voltage power line 14b and the low-voltage power line 12b. The power gating circuit 200 includes current switches SF0, SF1 and SF2 and a switching controller 210. In an exemplary embodiment, the current switches SF0, SF1 and SF2 are embodied with transistors (e.g., NMOS transistors). In an exemplary embodiment where only two switches SF0 and SF1 are provided (e.g., SF2 is omitted), the current driving capability (e.g., the aspect ratio of channel width/channel length) of the second current switch SF1 is greater than the current driving capability of the first current switch SF0. For example, a first current is driven when the first current switch SF0 is turned on and a second current larger than the first current is driven when the second current switch SF1 is turned on. For example, the first current switch SF0 provides the first current when the first current switch SH0 is turned on and the second current switch SF1 provides the second current when the second current switch SF1 is turned on. In an exemplary embodiment where at least three current switches SF0, SF1 and SF2 are provided, the remaining current switches SF1 and SF2 except for the first current switch SF0 have the same current driving capability. The switching controller 210 receives a power gating enable signal PGEN serving as an operating mode signal from a power management unit PMU 16 through a signal line SL1. In an exemplary embodiment, the power gating enable signal PGEN is maintained in a high state in a sleep mode and is maintained in a low state in an active mode. The switching controller 210 applies an inverted version of the operating mode signal to a gate of the first current switch SF0 through a signal line SL2 without delay or without significant delay. In addition, the switching controller 210 applies the inverted version of the operating mode signal to a gate of the second current switch SF1 through a signal line SL3 as a switching control signal SW by delaying the inverted version of the operating mode signal. The switching controller 210 receives the virtual low voltage VVSS through a signal line SL4 and detects a level of the virtual low voltage VVSS to determine the delay characteristic of the switching control signal SW. After the second current switch SF1 is turned on, a delayed switching control signal SW is transferred to a gate of the third current switch SF2 through a delay buffer DB so that the first to third current switches SF0, SF1 and SF2 are sequentially turned on. Therefore, a large supply current is generated from a power source after the voltage level of the virtual low-voltage power line 14b has been sufficiently decreased by a small supply current. As such, the power noise may be prevented.

For example, in the initial stage of converting the mode from the sleep mode to the active mode in response to the operating mode signal, the switching controller 210 turns on the first current switch SF0 to gradually decrease the operating supply voltage VVSS using the first current, which is relatively small, and generates a reference voltage VREF (e.g., see FIG. 10 and FIG. 11), which changes more slowly than the operating supply voltage VVSS, based on the operating supply voltage VVSS. In addition, the switching controller 210 turns on the second current switch SF1 based on the level of the reference voltage VREF to supply the second current, which is relatively large, to the circuit block 14. Thus, according to the exemplary embodiment, a time delay characteristic greater than the time delay characteristic obtained by the delay buffer DB can be acquired through the switching controller 210, so an area occupied by the delay buffer DB can be reduced.

In an exemplary embodiment, if power lines are arranged in a grid type and a plurality of sleep transistors are arranged in a lattice structure, a greater effect may be expected.

Figure 10:
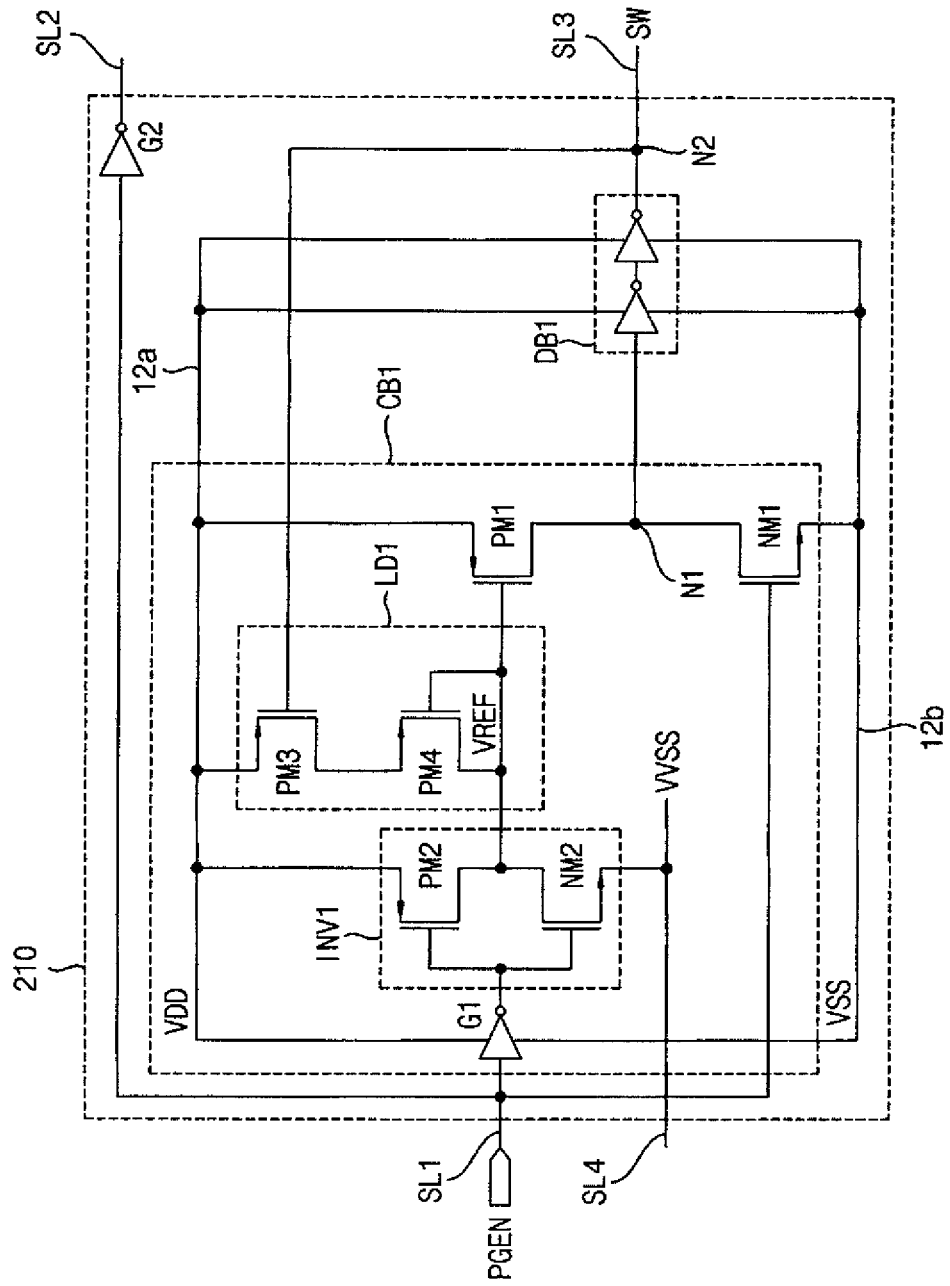
FIG. 10 is a detailed circuit diagram illustrating a switching controller shown in FIG. 9 according to an exemplary embodiment of the inventive concept.

FIG. 10 is a detailed circuit diagram illustrating the switching controller shown in FIG. 9 according to an exemplary embodiment of the inventive concept.

The switching controller 210 includes an inverter G2, a delay buffer DB1 and a voltage detection control buffer CB1. The inverter G2 inverts the operating mode signal PGEN to supply the inverted version of the operating mode signal to the first current switch SF0 through the signal line SL2. The delay buffer DB1 is connected between a first node N1 and a second node N2 and supplies voltage to the second current switch SF1 through the signal line SL3 as the switching control signal SW by buffering voltage of the first node N1.

The voltage detection control buffer CB1 generates the reference voltage VREF, which is maintained higher than the operating supply voltage VVSS supplied through the virtual low-voltage power line 14b, and outputs an inverted version of the operating mode signal PGEN through the first node N1 after delaying a rising transition of the inversed version of the operating mode signal PGEN until the reference voltage VREF reaches a predetermined voltage level. In addition, the voltage detection control buffer CB1 disables a pull-up path between the high-voltage power line 12a of the power rail 12 and the reference voltage VREF in response to an output signal of the delay buffer DB1.

The voltage detection control buffer CB1 includes a pull-up transistor PM1, a pull-down transistor NM1, inverters G1 and INV1 and a level detection unit LD1. The pull-up transistor PM1 is connected between the high-voltage power line 12a of the power rail 12 and the first node N1. The pull-down transistor NM1 is connected between the low-voltage power line 12b of the power rail 12 and the first node N1 and the operating mode signal PGEN is applied to a gate of the pull-down transistor NM1. The inverter G1 receives the supply voltage VDD and VSS through the power rail 12 and applies the operating mode signal PGEN to an input terminal of the inverter INV1 by inverting the operating mode signal PGEN. The inverter INV1 is operated by using the operating supply voltage VVSS supplied through the virtual low-voltage power line 14b and generates the reference voltage VREF by inverting the inverted version of the operating mode signal PGEN received from the inverter G1 to apply the reference voltage VREF to the gate of the pull-up transistor PM1. The inverter INV1 includes a PMOS transistor PM2 having a source connected to the high-voltage power line 12a of the power rail 12 and a drain connected to the gate of the pull-up transistor PM1 and an NMOS transistor NM2 having a drain connected to the gate of the pull-up transistor PM1 and a source connected to the virtual low-voltage power line 14b through a signal line SL4. The inverted version of the operating mode signal PGEN, which is an output signal of the inverter G1, is commonly applied to the gates of the PMOS transistor PM2 and the NMOS transistor NM2.

The level detection unit LD1 includes a PMOS transistor PM4 having a gate and a drain commonly connected to the gate of the pull-up transistor PM1 and a PMOS transistor PM3 connected between the source of the PMOS transistor PM4 and the high-voltage power line 12a and having a gate connected to the second node N2.

Figure 11:
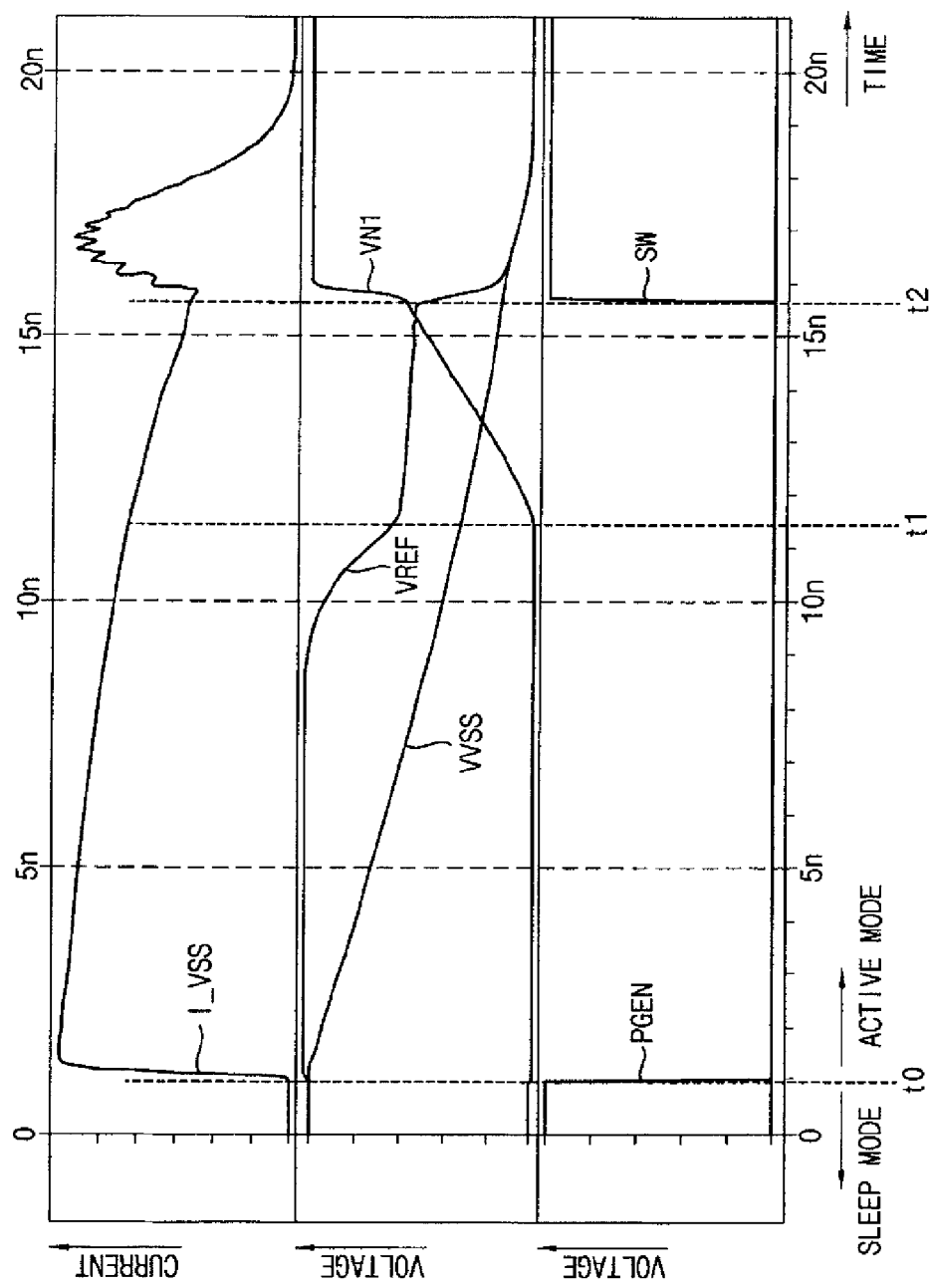
FIG. 11 is a view illustrating exemplary waveforms to explain an operation of the footer-type power gating circuit shown in FIGS. 9 and 10 according to an exemplary embodiment.

FIG. 11 is a view illustrating exemplary waveforms to explain an operation of the exemplary embodiment shown in FIGS. 9 and 10.

Referring to FIG. 11, when the operating mode signal PGEN is transitioned from the high state to the low state at the time t0, the first current switch SF0 is turned on in response to the inverted version of the operating mode signal PGEN provided from the inverter G2, so supply current I_VSS that is relatively small flows from the virtual low-voltage power line 14b to the low-voltage power line 12b. Thus, the virtual low voltage VVSS of the virtual low-voltage power line 14b is gradually decreased due to the supply current I_VSS. At the same time, since a signal having the low state is applied to the gate of the pull-down transistor NM1, the pull-down transistor NM1 is turned off and pull-down current sinking from the first node N1 is shut off. However, the inverter INV1 is operated by using the operating supply voltage VVSS and the operating supply voltage VVSS is in the high state when the operating mode signal PGEN is initially transitioned from the high state to the low state, so the inverter INV1 may not instantly transfer the inverted version of the operating mode signal PGEN to the gate of the pull-up transistor PM1. Therefore, both of the pull-up transistor PM1 and the pull-down transistor NM1 are kept in the turn-off state, so the first node N1 is maintained in the floating state. Thus, voltage VN1 of the first node N1 is maintained at the previous state, that is, the low state. Accordingly, the PMOS transistor PM3 of the level detection unit LD1 is kept in the turn-on state to provide the pull-up path between the reference voltage VREF and the high-voltage power line 12a of the power rail 12, so that the level detection unit LD1 is maintained in the level detection enable state.

In addition, when the level of the operating supply voltage VVSS supplied through the virtual low-voltage power line 14b is equal to or greater than a difference between the high voltage VDD and a threshold voltage of the NMOS transistor NM2, the NMOS transistor NM2 is kept in the turn-off state, so the gate of the pull-up transistor PM1 is maintained in the floating state. In other words, the gate of the pull-up transistor PM1 is maintained in the previous state, that is, the high state. Thus, the reference voltage VREF is maintained in the level of the high voltage VDD.

As the level of the operating supply voltage VVSS, which is the voltage of the virtual low-voltage power line 14b, is decreased, the NMOS transistor NM2 is turned on, so that the reference voltage VREF starts to decrease. Since the reference voltage VREF is generated by using the operating supply voltage VVSS, the reference voltage VREF is always kept higher than the operating supply voltage VVSS. At the time t1 at which the reference voltage VREF is decreased lower than the level of threshold voltage VTH_PM4 of the PMOS transistor PM4, the PMOS transistor PM4 is turned on and the level of the reference voltage VREF is expressed by equation 2 as follows:

$$VDD-(VTH\_PM4+(Ron\_PM3*Id)) \qquad (2).$$

In the above equation 2, Ron_PM3 represents a resistance of the PMOS transistor PM3 when the PMOS transistor PM3 is turned on and Id represents a current flowing through the PMOS transistors PM3 and PM4 from the high voltage VDD to the reference voltage VREF.

Since all of the PMOS transistors PM3 and PM4 included in the level detection unit LD1 are turned on and the pull-up path between the reference voltage VREF and the high-voltage power line 12a of the power rail 12 is enabled, the signal output from an output terminal of the inverter INV1 is pulled-up through the pull-up path, so the reference voltage VREF is substantially maintained at VDD-(VTH_PM4+(Ron_PM3*Id)).

At this time, the pull-up transistor PM1 is also turned on, so the first node N1 is charged through the pull-up transistor PM1. Thus, voltage VN1 of the first node N1 gradually increases. At this time, as described above, since the gate voltage of the pull-up transistor PM1 is substantially maintained without being decreased along the falling slope of the operating supply voltage VVSS, the voltage VN1 of the first node N1 is slowly pulled-up without being rapidly pulled-up. If the voltage VN1 of the first node N1 is increased higher than the switching point of the delay buffer DB1 at the time t2, the switching control signal SW, which is output through the second node N2 and supplied to the second current switch SF1, is transitioned from the low state to the high state, so that the second current switch SF1 is turned on. As shown in FIG. 11, when the second current switch SF1 is turned on, the supply current I_VSS sinking to the low voltage VSS increases instantly or rapidly. However, since the operating supply voltage VVSS has been sufficiently decreased, the intensity of the supply current I_VSS instantly or rapidly sinking to the low voltage VSS when the second current switch SF1 is turned on may not be high.

In addition, the switching control signal SW transitioned to the high state is fed back from the second node N2 to the PMOS transistor PM3, so the PMOS transistor PM3 is turned off. Thus, the pull-up path supplied by the level detection unit LD1 between the reference voltage VREF and the high-voltage power line 12a of the power rail 12 is disabled.

If the PMOS transistor PM3 is turned off, the gate voltage of the pull-up transistor PM1 is rapidly decreased along the slope of the operating supply voltage VVSS, so a drain current of the pull-up transistor PM1 may be maximized. Thus, the voltage VN1 of the first node N1 is rapidly pulled-up to the level of the high voltage VDD.

In the active mode, the PMOS transistor PM3 is turned off and the pull-up path of the level detection unit LD1 is shut off, to prevent power consumption by the switching controller 210.

Therefore, as shown in FIG. 11, according to the exemplary embodiment of FIGS. 9 and 10, the second current switch SF1 capable of driving relatively large current can be turned on after sufficient time delay of 10 ns or more from the time t0 at which the operating mode signal PGEN is transitioned to the low state so that the sleep mode is converted into the active mode. The above configuration may effectively reduce the area occupied by the power gating circuit.

Figure 12:
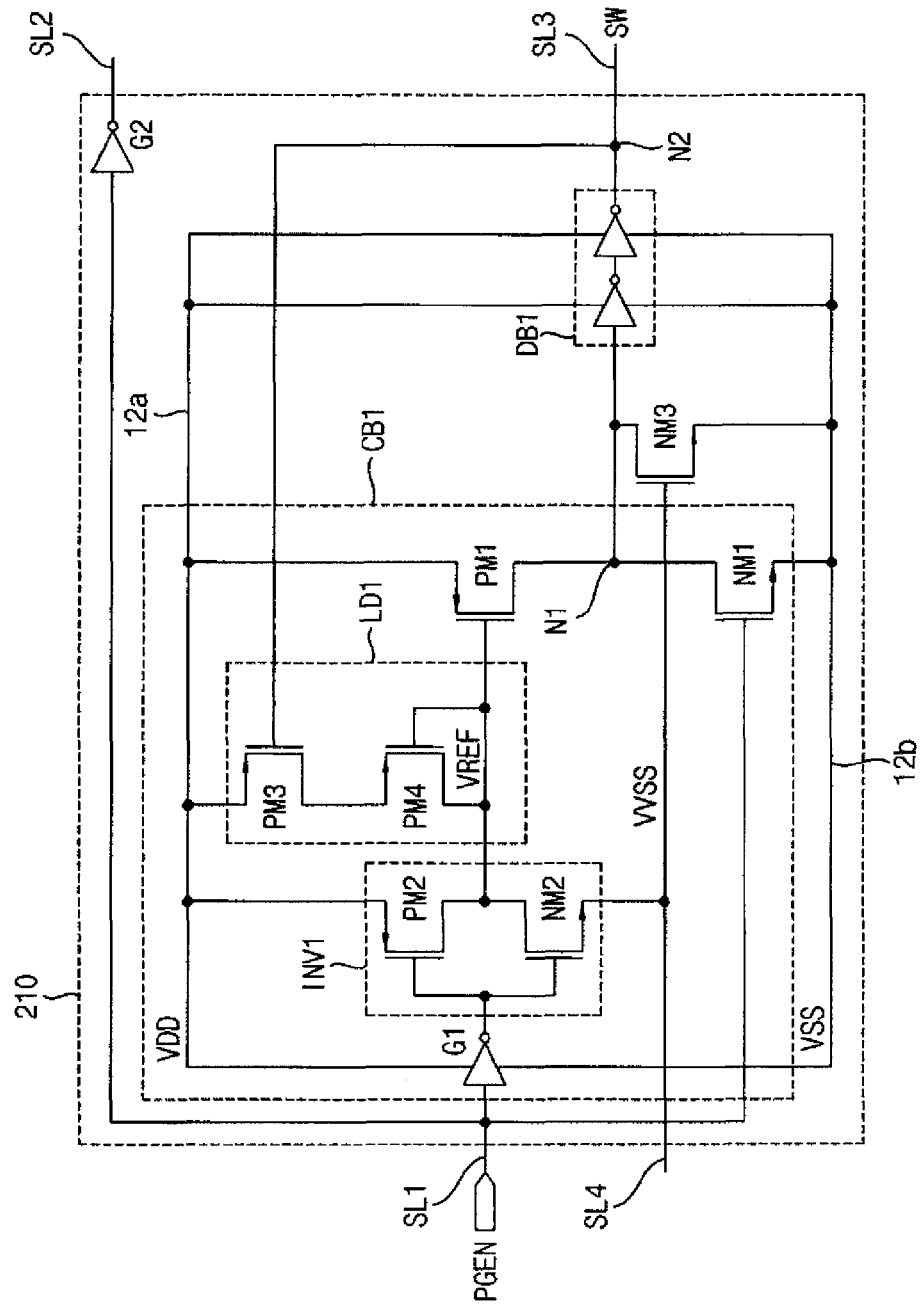
FIG. 12 is a detailed circuit diagram illustrating a switching controller shown in FIG. 9 according to an exemplary embodiment of the inventive concept.

FIG. 12 is a detailed circuit diagram illustrating the switching controller shown in FIG. 9 according to an exemplary embodiment of the inventive concept.

The exemplary embodiment is similar to the exemplary embodiment of FIG. 9 and FIG. 10 except that a pull-down transistor NM3 is further connected between the low-voltage power line 12b and the first node N1 and the operating supply voltage VVSS is applied to a gate of the pull-down transistor NM3, so the same reference numerals will be assigned to the same elements.

Since the pull-down transistor NM3 can sink current from the first node N1 until the operating supply voltage VVSS sufficiently decreases such that the pull-down transistor NM3 is turned off, the pull-up time caused by charging the first node N1 can be more delayed.

Therefore, according to the exemplary embodiment of FIG. 12, the turn-on time of the second current switch SF1 can be more delayed from the time at which the operating mode signal PGEN is transitioned to the low state so that the sleep mode is converted into the active mode.

Figure 13:
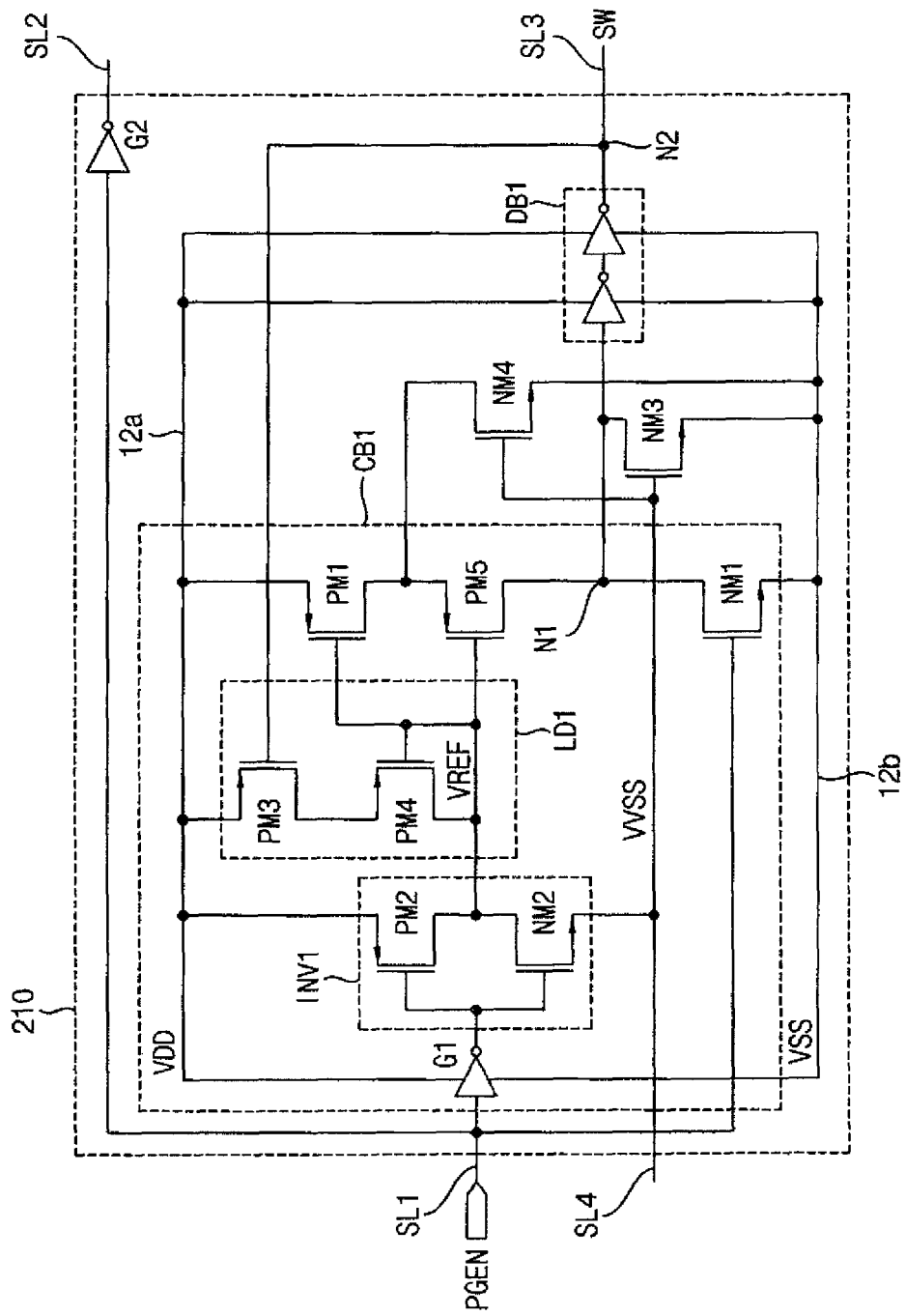
FIG. 13 is a detailed circuit diagram illustrating a switching controller shown in FIG. 9 according to an exemplary embodiment of the inventive concept.

FIG. 13 is a detailed circuit diagram illustrating the switching controller shown in FIG. 9 according to an exemplary embodiment of the inventive concept.

The exemplary embodiment is similar to the exemplary embodiment of FIG. 12 except that a PMOS transistor PM5 is further connected between the first node N1 and the drain of the pull-up transistor PM1 and an NMOS transistor NM4 is further connected between the low-voltage power line 12b and the drain of the pull-up transistor PM1, so the same reference numerals will be assigned to the same elements.

A gate of the PMOS transistor PM5 is connected to the gate of the pull-up transistor PM1 and the operating supply voltage VVSS is applied to a gate of the NMOS transistor NM4. Thus, the PMOS transistor PM5 may not be turned on by the NMOS transistor NM4 unless the operating supply voltage VVSS is sufficiently decreased to turn off the NMOS transistor NM4, so the charge path of the first node N1 is shut off. After the operating supply voltage VVSS is sufficiently decreased to turn off the NMOS transistor NM4, the PMOS transistor PM5 is turned on. If the PMOS transistor PM5 is turned on, the charge path of the first node N1 is formed so that the pull-up starts. Therefore, according to the exemplary embodiment of FIG. 13, the second current switch SF1 is turned on after a time has been delayed more than the delay time of the exemplary embodiment of FIGS. 9-10 and the exemplary embodiment of FIG. 12, so the large current starts to flow after the operating supply voltage VVSS substantially reaches the low voltage VSS, thereby reducing the power noise.

Figure 14:
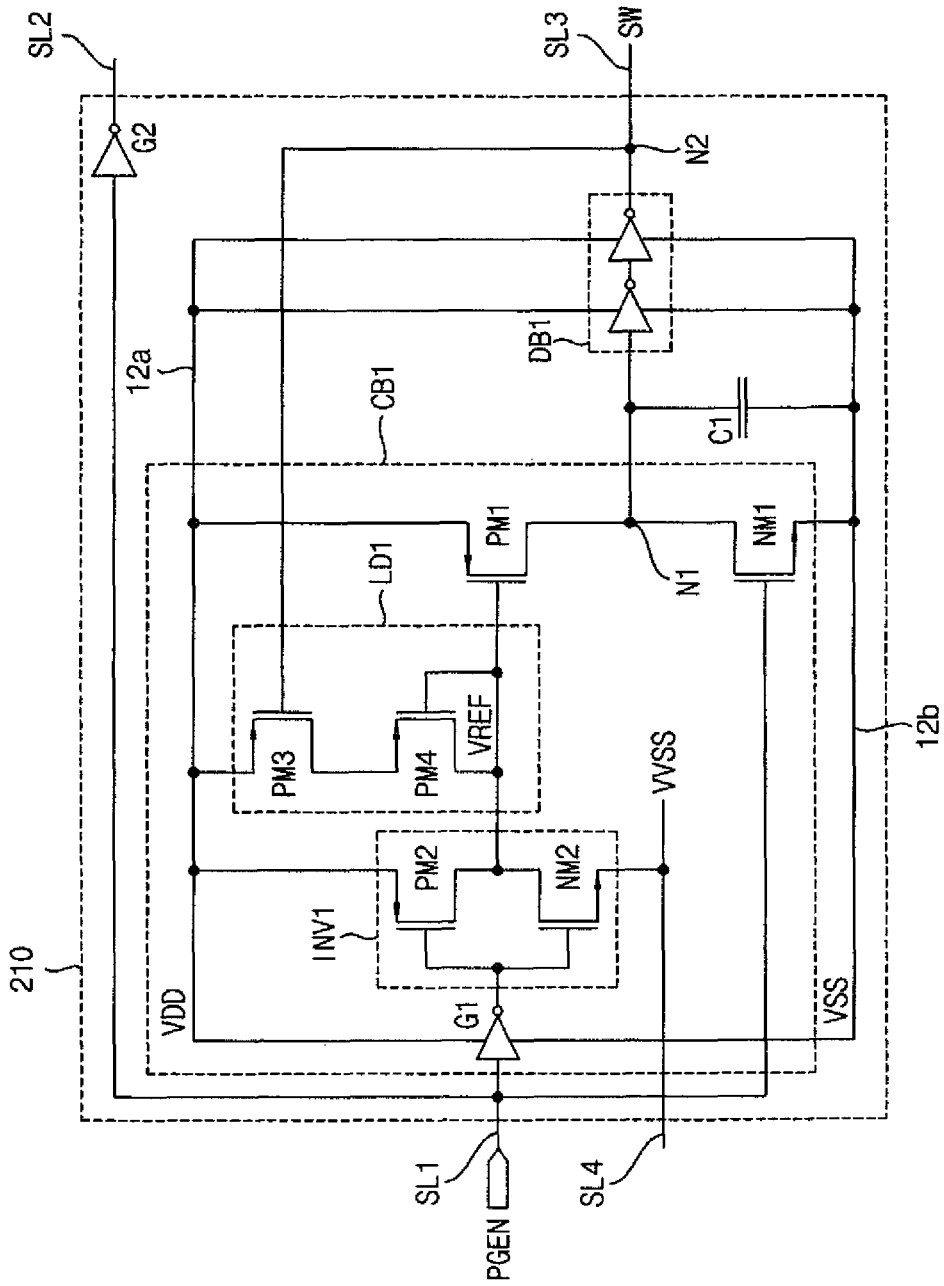
FIG. 14 is a detailed circuit diagram illustrating a switching controller shown in FIG. 9 according to an exemplary embodiment of the inventive concept.

FIG. 14 is a detailed circuit diagram illustrating the switching controller shown in FIG. 9 according to an exemplary embodiment of the inventive concept.

The exemplary embodiment is different from other exemplary embodiments in that a capacitor C1 is connected between the first node N1 and the low-voltage power line 12b. Since the capacitor C1 is fully discharged to maintain the voltage VN1 of the first node N1 to the low voltage VSS during the sleep mode, the capacitor C1 delays the time for increasing the level of the first node N1 to the switching point of the delay buffer DB1 when the charge path is formed through the pull-up transistor PM1.

Figure 15:
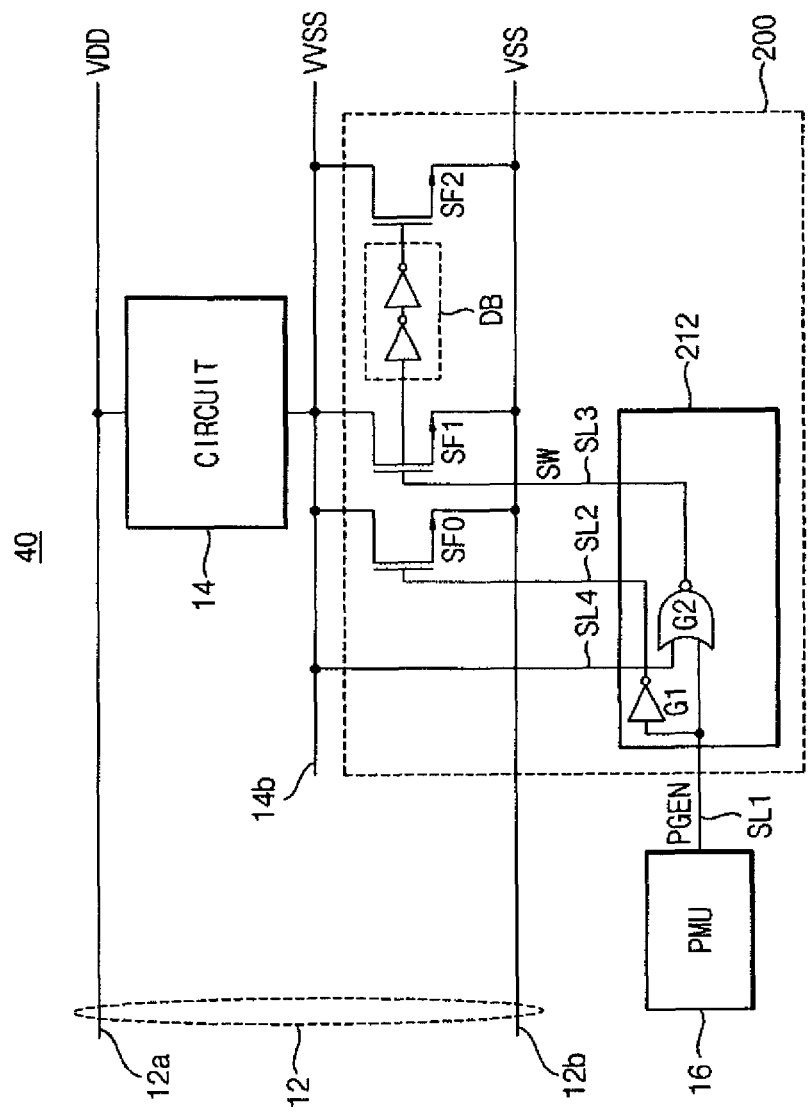
FIG. 15 is a detailed circuit diagram illustrating a switching controller shown in FIG. 9 according to an exemplary embodiment of the inventive concept.

FIG. 15 is a detailed circuit diagram illustrating the switching controller shown in FIG. 9 according to an exemplary embodiment of the inventive concept.

Referring to FIG. 15, an integrated circuit apparatus 40 according to the exemplary embodiment is different from other exemplary embodiments in that a switching controller 212 includes an inverter G1 and a NOR gate G2.

The signal line SL1 through which the operating mode signal PGEN is provided is connected to one input terminal of the NOR gate G2. The virtual low-voltage power line 14b is connected to the other input terminal of the NOR gate G2 through the signal line SL4. The output signal of the NOR gate G2 is the switching control signal SW. An output terminal of the NOR gate G2 is connected to the signal line SL3.

The operating mode signal PGEN provided from the power management unit PMU 16 is applied to the first current switch SF0 through the inverter G1.

Therefore, the NOR gate G2 delays the output of the operating mode signal PGEN applied to the one input terminal until the level of the operating supply voltage VVSS of the virtual low-voltage power line 14b is sufficiently decreased lower than the threshold voltage of the NOR gate G2.

FIG. 16 is a view showing exemplary waveforms to explain operations of the header-type power gating circuits according to exemplary embodiments of the inventive concept.

In FIG. 16, VVSSP represents a typical operating supply voltage, VVSS1 represents the operating supply voltage according to the exemplary embodiment described with reference to FIG. 10, VVDD2 represents the operating supply voltage according to the exemplary embodiment described with reference to FIG. 15, I_VSSP represents current sinking to the low voltage according to the typical operating supply voltage, I_VSS1 represents current sinking to the low voltage according to the exemplary embodiment described with reference to FIG. 10, and I_VSS2 represents current sinking to the low voltage according to the exemplary embodiment described with reference to FIG. 15.

As shown in FIG. 16, unlike the exemplary embodiment of FIG. 10, the exemplary embodiment of FIG. 15 cannot acquire the sufficient delay time of 10 ns or more, but can acquire the delay time substantially approximate to 10 ns.

In addition, as shown in FIG. 16, when comparing with the peak value A of the current I_VSSP according, it can be understood that the peak value B of the current I_VSS2 according to the exemplary embodiment of FIG. 15 is reduced by about 41%, and the peak value C of the current I_VSS1 according to the exemplary embodiment of FIG. 10 is reduced by about 79%.

According to an exemplary embodiment of the inventive concept, one of the above-described exemplary power gating circuits (e.g., 100) is included within a System on Chip (SoC) along with one of the above-described power management units (e.g. 16). In this SoC embodiment, the circuit blocks 14 correspond to one or more circuit blocks within the SoC. A power gating function of the power gating circuit is controlled by the power management unit. In an active mode of the SoC, the power gating circuit supplies power to each circuit block (e.g., 14). In a sleep mode of the SoC, the power gating circuit prevents power from being applied to each circuit block it is attached to. The SoC may include additional circuit blocks that always receive power during the sleep mode. For example, the power gating circuit is not connected to these additional circuit blocks and accordingly, does not manage their power. The power gating circuit may reduce a leakage current of the SoC when the Soc is in a sleep mode or a standby mode.

The foregoing is illustrative of the present inventive concept and is not to be construed as limiting thereof. Although a few exemplary embodiments have been described, those skilled in the art will readily appreciate that many modifications are possible in the exemplary embodiments without materially departing from the teachings of the present inventive concept. Accordingly, all such modifications are intended to be included within the scope of the present inventive concept.

What is claimed is:
1. A power gating circuit comprising:
a first current switch connected between a power rail and a circuit block operated by an operating supply voltage, the first current switch providing a first current when the first current switch is turned on; and
a second current switch connected between the power rail and the circuit block, the second current switch providing a second current larger than the first current when the second current switch is turned on; and
a switching controller that turns on the first current switch when transitioned from a sleep mode to an active mode in response to an operating mode signal to change the operating supply voltage using the first current, generates a reference voltage based on the operating supply voltage that changes more slowly than the operating supply voltage, and turns on the second current switch based on the reference voltage to provide the second current to the circuit block, wherein each of the first and second current switches is connected between a high-voltage power line of the power rail and a virtual high-voltage power line that supplies the operating supply voltage to the circuit block, and the switching controller comprises:

a delay buffer that buffers a voltage of a first node to supply the buffered voltage to the second current switch; and a voltage detection control buffer that generates the reference voltage maintained lower than the operating supply voltage supplied through the virtual high-voltage power line, and outputs the operating mode signal through the first node after delaying a falling transition of the operating mode signal until the reference voltage reaches a predetermined voltage level, and disables a pull-down path between the reference voltage and a low-voltage power line of the power rail in response to an output signal of the delay buffer.

2. The power gating circuit of claim 1, wherein the switching controller comprises a level detection unit that generates the reference voltage, and the switching controller disables the level detection unit after turning on the second current switch.

3. The power gating circuit of claim 1, wherein the voltage detection control buffer comprises:

a pull-up transistor connected between the high-voltage power line of the power rail and the first node;

a pull-down transistor connected between the first node and the low-voltage power line of the power rail;

a first inverter that inverts the operating mode signal to supply the inverted operating mode signal to a gate of the pull-up transistor;

a second inverter operated by using the operating supply voltage, the second inverter generating the reference voltage by inverting the operating mode signal to supply the reference voltage to a gate of the pull-down transistor; and a level detection unit connected between a node, to which an output terminal of the second inverter and the gate of the pull-down transistor are connected, and the low-voltage power line of the power rail, the level detection unit pulling down the output terminal of the second inverter through the pull-down path when the reference voltage reaches the predetermined voltage level to maintain the reference voltage to the predetermined voltage level and disabling the pull-down path based on the output signal of the delay buffer.

4. The power gating circuit of claim 3, wherein the level detection unit comprises:

a first NMOS transistor having a gate and a drain commonly connected to the gate of the pull-down transistor; and a second NMOS transistor connected between a source of the first NMOS transistor and the low-voltage power line and having a gate connected to an output terminal of the delay buffer.

5. The power gating circuit of claim 3, further comprising:
a first PMOS transistor connected between the high-voltage power line of the power rail and the first node and having a gate connected to the virtual high-voltage power line.

6. The power gating circuit of claim 5, further comprising:
an NMOS transistor connected between the first node and a drain of the pull-down transistor and having a gate connected to the gate of the pull-down transistor; and a second PMOS transistor connected between the high-voltage power line of the power rail and the drain of the pull-down transistor and having a gate connected to the virtual high-voltage power line.

7. The power gating circuit of claim 1, further comprising:
a capacitor connected between the first node and the low-voltage power line of the power rail.

8. A power gating circuit comprising:

a first current switch connected between a power rail and a circuit block operated by an operating supply voltage, the first current switch providing a first current when the first current switch is turned on; and a second current switch connected between the power rail and the circuit block, the second current switch providing a second current larger than the first current when the second current switch is turned on; and a switching controller that turns on the first current switch when transitioned from a sleep mode to an active mode in response to an operating mode signal to change the operating supply voltage using the first current, generates a reference voltage based on the operating supply voltage that changes more slowly than the operating supply voltage, and turns on the second current switch based on the reference voltage to provide the second current to the circuit block, wherein each of the first and second current switches is connected between a virtual low-voltage power line that supplies the operating supply voltage to the circuit block and a low-voltage power line of the power rail, and the switching controller comprises:

a first inverter that inverts the operating mode signal to supply the inverted version of the operating mode signal to the first current switch;

a delay buffer that buffers a voltage of a first node to supply the buffered voltage to the second current switch; and a voltage detection control buffer that generates the reference voltage maintained higher than the operating supply voltage supplied through the virtual low voltage power line, outputs an inverted version of the operating mode signal through the first node after delaying a rising transition of the inverted version of the operating mode signal until the reference voltage reaches a predetermined voltage level, and disables a pull-up path between the reference voltage and a high-voltage power line of the power rail in response to an output signal of the delay buffer.

9. The power gating circuit of claim 8, wherein the voltage detection control buffer comprises:

a pull-up transistor connected between the high-voltage power line of the power rail and the first node;

a pull-down transistor connected between the first node and the low-voltage power line of the power rail and having a gate receiving the operating mode signal;

a second inverter that inverts the operating mode signal;

a third inverter operated by using the operating supply voltage, the third inverter generating the reference voltage by inverting an output signal of the second inverter to supply the reference voltage to a gate of the pull-up transistor; and a level detection unit connected between a node, to which an output terminal of the third inverter and the gate of the pull-up transistor are connected, and the high-voltage power line of the power rail, the level detection unit pulling up the output terminal of the third inverter through the pull-up path when the reference voltage reaches the predetermined voltage level to maintain the reference voltage to the predetermined voltage level and disabling the pull-up path based on the output signal of the delay buffer.

10. The power gating circuit of claim 9, wherein the level detection unit comprises:
   a first PMOS transistor having a gate and a drain commonly connected to the gate of the pull-up transistor; and
   a second PMOS transistor connected between a source of the first PMOS transistor and the high-voltage power line and having a gate connected to an output terminal of the delay buffer.

11. The power gating circuit of claim 9, further comprising:
   a first NMOS transistor connected between the first node and the low-voltage power line of the power rail and having a gate connected to the virtual low-voltage power line.

12. The power gating circuit of claim 11, further comprising:
   a PMOS transistor connected between the first node and a drain of the pull-up transistor and having a gate connected to the gate of the pull-up transistor; and
   a second NMOS transistor connected between the low-voltage power line of the power rail and the drain of the pull-up transistor and having a gate connected to the virtual low-voltage power line.

13. The power gating circuit of claim 8, further comprising:
   a capacitor connected between the first node and the low-voltage power line of the power rail.

* * * * *